(12) United States Patent
Kim et al.

(10) Patent No.: US 11,508,718 B2
(45) Date of Patent: Nov. 22, 2022

(54) SEMICONDUCTOR DEVICE

(71) Applicant: Samsung Electronics Co., Ltd., Suwon-si (KR)

(72) Inventors: Sukjin Kim, Seoul (KR); Mijin Lee, Yongin-si (KR); Namho Kim, Yongin-si (KR); Chanhee Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 157 days.

(21) Appl. No.: 16/921,846

(22) Filed: Jul. 6, 2020

(65) Prior Publication Data

US 2021/0175225 A1 Jun. 10, 2021

(30) Foreign Application Priority Data

Dec. 5, 2019 (KR) .................. 10-2019-0160286

(51) Int. Cl.
*H01L 27/02* (2006.01)
*H01L 29/78* (2006.01)
*H01L 21/8234* (2006.01)
*H01L 27/088* (2006.01)
*H01L 29/66* (2006.01)

(52) U.S. Cl.
CPC .. *H01L 27/0266* (2013.01); *H01L 21/823431* (2013.01); *H01L 21/823493* (2013.01); *H01L 27/0886* (2013.01); *H01L 29/66795* (2013.01); *H01L 29/785* (2013.01)

(58) Field of Classification Search
CPC ......... H01L 27/0266; H01L 21/823431; H01L 21/823493; H01L 27/0886; H01L 29/66795; H01L 29/785; H01L 27/027; H01L 27/088; H01L 29/42392; H01L 29/78696; H01L 27/0207; H01L 29/0603; H01L 29/0684; H01L 23/528; H01L 23/60; H01L 27/0296
USPC ........................................................ 257/288
See application file for complete search history.

(56) References Cited

U.S. PATENT DOCUMENTS

| | | | |
|---|---|---|---|
| 5,270,565 A * | 12/1993 | Lee | ....................... H01L 27/0266 257/358 |
| 5,272,371 A * | 12/1993 | Bishop | ................. H01L 27/0251 257/361 |
| 5,581,104 A | 12/1996 | Lowrey et al. | |
| 6,472,286 B1 | 10/2002 | Yu | |
| 7,098,513 B2 | 8/2006 | Chatty et al. | |
| 7,615,826 B2 | 11/2009 | Huang et al. | |
| 8,513,774 B2 | 8/2013 | Chen et al. | |

(Continued)

*Primary Examiner* — Mohammad M Hoque
(74) *Attorney, Agent, or Firm* — Muir Patent Law, PLLC

(57) ABSTRACT

A semiconductor device includes first well regions in a substrate and spaced apart from each other, a connection doped region between the first well regions, and a first interconnection line electrically connected to the connection doped region through a first contact. The first well regions and the connection doped region include impurities of a first conductivity type, and a concentration of the impurities in the connection doped region is higher than that in the first well regions. The first well regions extend into the substrate to a depth larger than that of the connection doped region. A first portion of the connection doped region is disposed in the first well regions and a second portion of the connection doped region contacts the substrate.

20 Claims, 19 Drawing Sheets

(56) References Cited

U.S. PATENT DOCUMENTS

| | | | |
|---|---|---|---|
| 8,937,356 B2 | 1/2015 | Mallikarjunaswamy | |
| 9,406,667 B2 | 8/2016 | Lai | |
| 9,640,526 B2 | 5/2017 | Narita | |
| 10,083,952 B2 | 9/2018 | Lee et al. | |
| 10,103,136 B2 | 10/2018 | Huang et al. | |
| 2018/0151554 A1 | 5/2018 | Peng et al. | |
| 2018/0226394 A1 | 8/2018 | Lee et al. | |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2019-0160286, filed on Dec. 5, 2019, in the Korean Intellectual Property Office, the entire contents of which are hereby incorporated by reference.

BACKGROUND OF THE INVENTION

The present disclosure relates to a semiconductor device, and in particular, to, a semiconductor device including an electrostatic discharge (ESD) protection circuit for integrated circuits.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being scaled down. A variety of studies are being conducted to overcome technical limitations associated with the scale-down of the semiconductor device and to realize high performance semiconductor devices. For example, fin and multi-bridge-channel field-effect transistors of three-dimensional channel structures are being used to realize highly-integrated semiconductor devices. The semiconductor device further includes an electrostatic discharge (ESD) protection circuit to protect an internal circuit from an electrostatic discharge current. Recently, a lot of researches are conducted to provide a highly-reliable ESD protection circuit that is compatible with the field effect transistors having the three-dimensional channel structure.

SUMMARY

Some example embodiments of the inventive concept provide a semiconductor device with a high-reliably ESD protection circuit (or, device).

Some example embodiments of the inventive concept provide a semiconductor device including an ESD protection device, which can be easily integrated along with a field effect transistor of a three-dimensional channel structure.

According to an embodiment of the inventive concept, a semiconductor device may include first well regions disposed in a substrate and spaced apart from each other, a connection doped region disposed between the first well regions to connect the first well regions, and a first interconnection line electrically connected to the connection doped region through a first contact. The first well regions and the connection doped region may include impurities of a first conductivity type, and a concentration of the impurities in the connection doped region may be higher than that in the first well regions. The first well regions may be extended into the substrate to have a depth larger than that of the connection doped region. A first portion of the connection doped region may be disposed in the first well regions and a second portion of the connection doped region may contact the substrate.

According to an embodiment of the inventive concept, a semiconductor device may include a substrate including an active fin, the active fin protruding upward from the substrate and extending in a first direction, first well regions provided in the substrate and spaced apart from each other in the first direction, a connection doped region disposed in the active fin between the first well regions, and a first interconnection line electrically connected to the connection doped region through a first contact. The first well regions and the connection doped region may include impurities of a first conductivity type, and a concentration of the impurities in the connection doped region may be higher than that in the first well regions. A first portion of the connection doped region may be disposed in the first well regions and a second portion of the connection doped region may contact the substrate.

According to an embodiment of the inventive concept, a semiconductor device may include a substrate including impurities of a first conductivity type, a first first well region and a second first well region disposed in a substrate and spaced apart from each other in a first direction, a connection doped region disposed between the first and second first well regions, a first first doped region disposed in the first first well region and a second first doped region disposed in the second first well region, and a first interconnection line electrically connected to the connection doped region and the first and second first doped regions through first contacts. Each of the first and second first well regions, the connection doped region, and the first and second first doped regions may include impurities of a second conductivity type different from the first conductivity type. A concentration of the impurities in each of the connection doped region and the first and second first doped regions may be higher than that in each of the first and second first well regions. A first portion of the connection doped region may be disposed in the first first well region, a second portion opposite to the first portion of the connection doped region may be disposed in the second first well region, and a third portion between the first and second portions of the connection doped region may contact the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
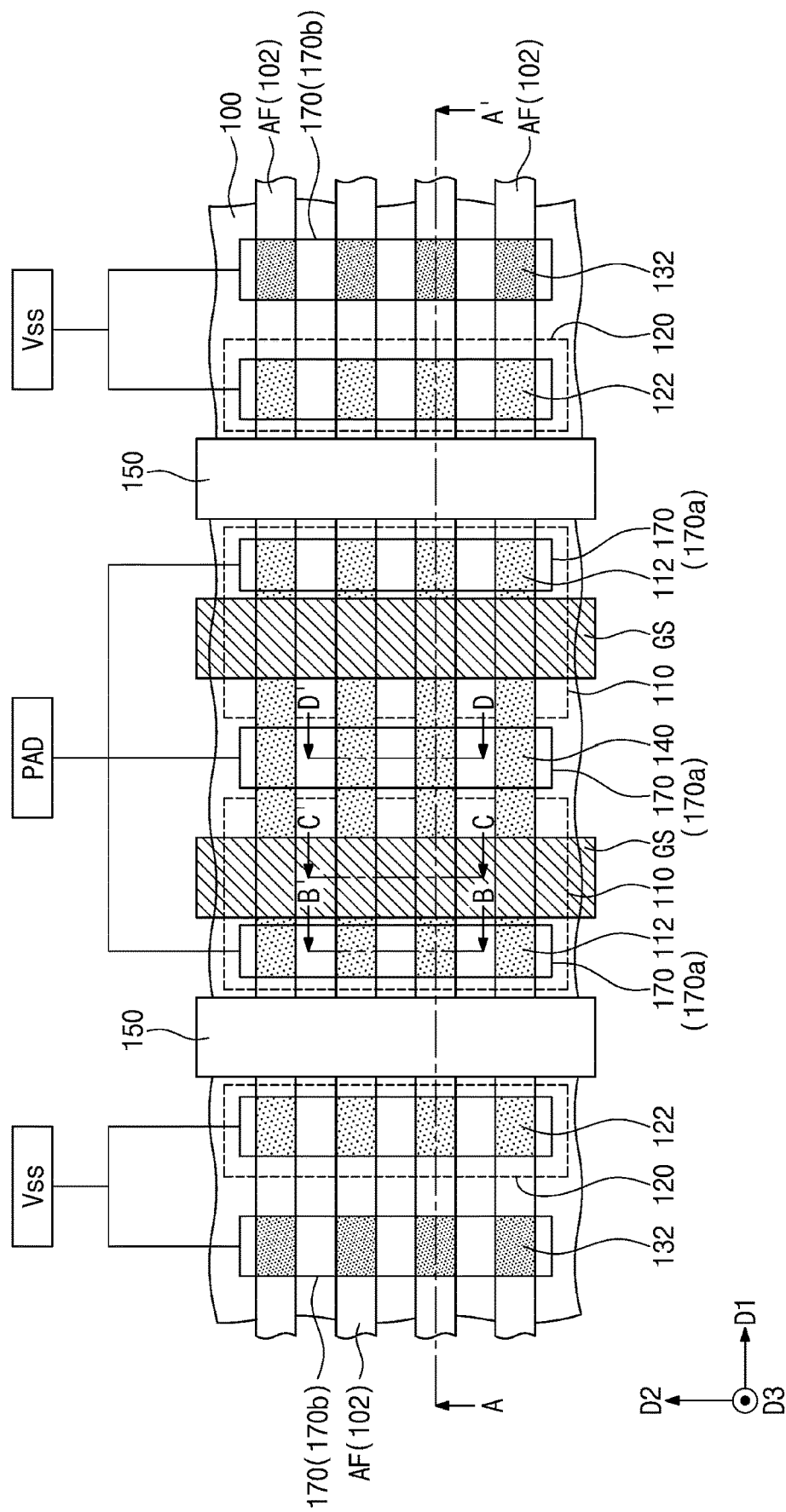
FIG. 1 is a plan view illustrating a semiconductor device according to an embodiment of the inventive concept.
Figure 2:
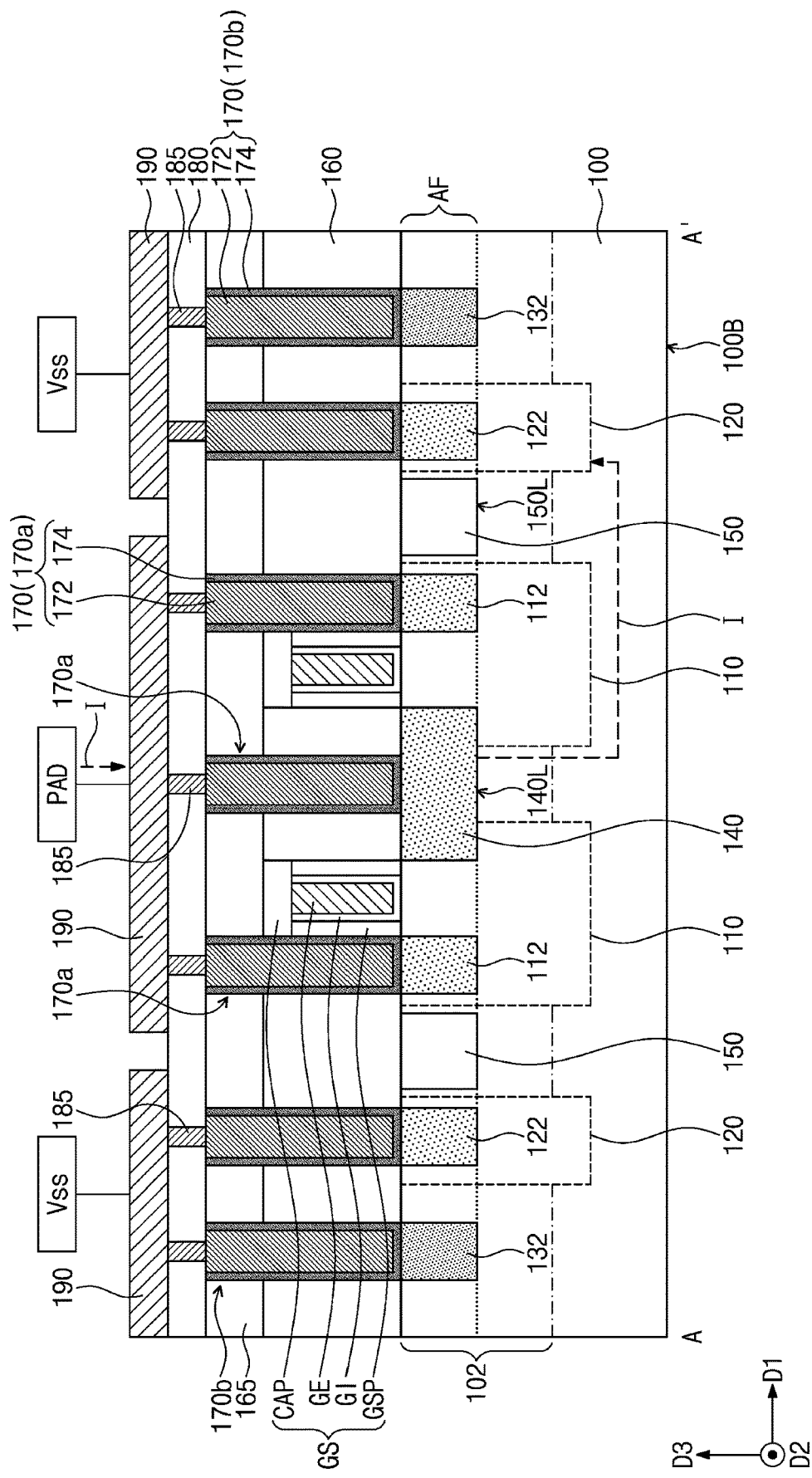
FIG. 2 is a sectional view taken along a line A-A' of FIG. 1 according to example embodiments.
Figure 3:
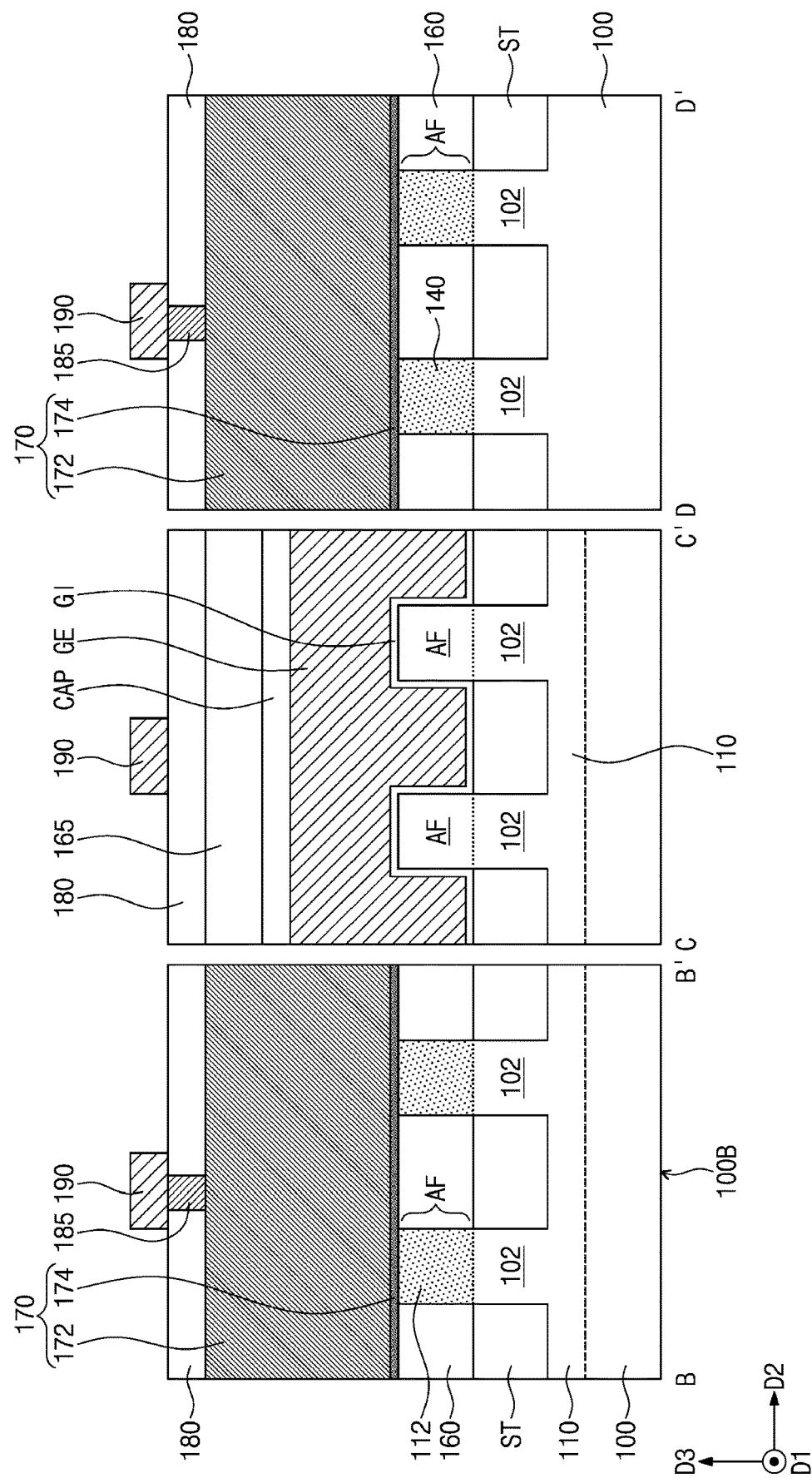
FIG. 3 is a sectional view taken along lines B-B', C-C', and D-D' of FIG. 1 according to example embodiments.

FIG. 1 is a plan view illustrating a semiconductor device according to an embodiment of the inventive concept. FIG. 2 is a sectional view taken along a line A-A' of FIG. 1 according to example embodiments. FIG. 3 is a sectional view taken along lines B-B', C-C', and D-D' of FIG. 1 according to example embodiments.

Referring to FIGS. 1 to 3, first well regions 110 may be disposed in a substrate 100. The first well regions 110 may be spaced apart from each other in a first direction D1 and may be extended in a second direction D2 crossing the first direction D1. The first direction D1 and the second direction D2 may be parallel to a bottom surface 100B of the substrate 100. The substrate 100 may be a semiconductor wafer (e.g., a silicon wafer or a silicon-on-insulator (SOI) wafer. The first well regions 110 may be of a first conductivity type, and the substrate 100 may be of a second conductivity type different from the first conductivity type. In an embodiment, the first conductivity type may be an n type, and the second conductivity type may be a p type. The first well regions 110 may include impurities of the first conductivity type.

Second well regions 120 may be disposed in the substrate 100. The second well regions 120 may be spaced apart from each other in the first direction D1 with the first well regions 110 interposed therebetween, and may be extended in the second direction D2. The first well regions 110 may be disposed between the second well regions 120 and may be spaced apart from the second well regions 120. The second well regions 120 may have the same conductivity type (e.g., the first conductivity type) as the first well regions 110. The second well regions 120 may include impurities of the first conductivity type.

Device isolation patterns ST may be disposed in the substrate 100. The substrate 100 may include active patterns 102, which are defined by the device isolation patterns ST. The device isolation patterns ST may be extended in the first direction D1 to cross the first well regions 110 and the second well regions 120 and may be spaced apart from each other in the second direction D2. The device isolation patterns ST may be formed of or include at least one of oxide, nitride, and/or oxynitride. Each of the active patterns 102 may be interposed between corresponding ones of the device isolation patterns ST. The active patterns 102 may protrude upward from the substrate 100 in a third direction D3, which is perpendicular to the bottom surface 100B of the substrate 100. The active patterns 102 may be extended in the first direction D1 and may be spaced apart from each other in the second direction D2. Each of the active patterns 102 may include the first well regions 110 and the second well regions 120. In an embodiment, the first well regions 110 and the second well regions 120 may be extended to a region below the device isolation patterns ST.

The device isolation patterns ST may be provided to expose upper portions of the active patterns 102. Each of the active patterns 102 may include an upper portion (hereinafter, an active fin AF), which is exposed by the corresponding device isolation patterns ST. A height of the topmost surface of the active fin AF may be higher than a height of top surfaces of the device isolation patterns ST, and side surfaces of the active fin AF may be exposed by the corresponding device isolation patterns ST. In the present specification, the height may refer to a distance from the bottom surface 100B of the substrate 100.

A connection doped region 140 may be disposed in the active fin AF between the first well regions 110. The connection doped region 140 may be connected to the first well regions 110 and may have the same conductivity type (e.g., the first conductivity type) as the first well regions 110. It will be understood that when an element is referred to as being "connected" to another element or on another element, it may be directly connected or on the other element.

The connection doped region 140 may include a first portion, a second portion opposite to the first portion, and a third portion between the first and second portion. In some embodiments, the first and second portions of the connection doped region 140 may be disposed in the first well regions 110 and the third portion of the connection doped region 140 may be connected to the substrate 100. In some examples, the first portion of the connection doped region 140 is disposed in a first one of the first well regions 110 (left in FIG. 2), the second portion of the connection doped region 140 is disposed in a second one of the first well regions 110 (right in FIG. 2), and the third portion of the connection doped region 140 contacting the substrate 100 without going through the first well regions 110. The third portion of the connection doped region 140 may be disposed between the first and second ones of the first well regions 110.

The connection doped region 140 may include impurities of the first conductivity type. A concentration of impurities in the connection doped region 140 may be greater than that in the first well regions 110. The first well regions 110 may be extended into the substrate 100 to have a depth deeper than the connection doped region 140. The connection doped region 140 may form a PN junction, along with a portion (e.g., a corresponding one of the active patterns 102) of the substrate 100 between the first well regions 110.

First doped regions 112 may be disposed in the active fin AF and in the first well regions 110, respectively. The first doped regions 112 may be connected to the first well regions 110, respectively. The connection doped region 140 may be disposed between the first doped regions 112 and may be spaced apart from the first doped regions 112. In an embodiment, each of the first well regions 110 may be extended into the active fin AF between each of the first doped regions 112 and the connection doped region 140. For example, a portion of each of the first well regions 110 may be interposed between each of the first doped regions 112 and the connection doped region 140. The first doped regions 112 may have the same conductivity type (e.g., the first conductivity type) as the first well regions 110. The first doped regions 112 may include impurities of the first conductivity type, and a concentration of impurities in the first doped regions 112 may be higher than that in the first well regions 110.

Second doped regions 122 may be disposed in the active fin AF and in the second well regions 120, respectively. The second doped regions 122 may be connected to the second well regions 120, respectively. The second doped regions 122 may be spaced apart from each other with the connection doped region 140 and the first doped regions 112 interposed therebetween in the first direction D1. The second doped regions 122 may be spaced apart from the first doped regions 112, respectively. The second doped regions 122 may have the same conductivity type (e.g., the first conductivity type) as the second well regions 120. The second doped regions 122 may include impurities of the first conductivity type, and a concentration of impurities in the second doped regions 122 may be higher than that in the second well regions 120. In an embodiment, the second well regions 120 may be omitted. In this case, the second doped regions 122 may be disposed in the active fin AF and may be connected to a portion of the substrate 100 (i.e., a corresponding active pattern 102).

An insulating pattern 150 may be disposed between each of the first doped regions 112 and each of the second doped regions 122. The insulating pattern 150 may be disposed in the active fin AF and may be extended in the second direction D2 to cross a plurality of the active fins AF. In an embodiment, a height of a bottommost surface 150L of the insulating pattern 150 may be substantially equal to a height of a bottommost surface 140L of the connection doped region 140. The insulating pattern 150 may be formed of or include at least one of oxide, nitride, and/or oxynitride.

Third doped regions 132 may be disposed in the active fin AF. The third doped regions 132 may be spaced apart from each other in the first direction D1, and the connection doped region 140, the first doped regions 112, and the second doped regions 122 may be interposed between the third doped regions 132. The third doped regions 132 may be spaced apart from each of the second doped regions 122 and may be connected to the substrate 100 (i.e., the corresponding active pattern 102). The third doped regions 132 may have the same conductivity type (e.g., the second conductivity type) as the substrate 100. The third doped regions 132 may include impurities of the second conductivity type.

In an embodiment, each of the connection doped region 140 and the first to third doped regions 112, 122, and 132 may be locally provided in the active fin AF. In this case, the connection doped region 140 and the first to third doped regions 112, 122, and 132 may have bottom surfaces, which are located at a height equal to or higher than the top surfaces of the device isolation patterns ST. In another embodiment, the connection doped region 140 and the first to third doped regions 112, 122, and 132 may be partially extended into respective portions of the active patterns 102 below the active fins AF, unlike that illustrated in the drawings. In this case, the bottom surfaces of the connection doped region 140 and the first to third doped regions 112, 122, and 132 may be located at a height that is lower than the top surfaces of the device isolation patterns ST.

Gate structures GS may be disposed on the substrate 100 to cross the active fin AF. The gate structures GS may be extended in the second direction D2 and may be spaced apart from each other in the first direction D1. The gate structures GS may be disposed on the first well regions 110, respectively. The connection doped region 140 may be disposed in the active fin AF between the gate structures GS. The connection doped region 140 may be disposed at one side of each of the gate structures GS, and each of the first doped regions 112 may be disposed at an opposite side of each of the gate structures GS. In an embodiment, the gate structures GS may be dummy gate structures, which are in an electrically floating state. In another embodiment, the gate structures GS may be connected to a ground electrode Vss.

Each of the gate structures GS may include a gate electrode GE, which extends in the second direction D2 to cross the active fin AF, a gate insulating pattern GI between the gate electrode GE and the active fin AF, gate spacers GSP on side surfaces of the gate electrode GE, and a gate capping pattern CAP on a top surface of the gate electrode GE. The gate electrode GE may cover the exposed side surfaces of the active fin AF and may be extended to the top surfaces of the device isolation patterns ST. The gate insulating pattern GI may be interposed between the gate electrode GE and the exposed side surfaces of the active fin AF and between the gate electrode GE and the top surfaces of the device isolation patterns ST. The gate insulating pattern GI may be extended to regions between the gate electrode GE and the gate spacers GSP, and the topmost surface of the gate insulating pattern GI may be substantially coplanar with the top surface of the gate electrode GE. In an embodiment, the gate spacers GSP may be extended to cover side surfaces of the gate capping pattern CAP.

The gate electrode GE may be formed of or include at least one of doped semiconductor materials, conductive metal nitrides, and/or metals. The gate insulating pattern GI may be formed of or include at least one of silicon oxide, silicon nitride, silicon oxynitride, or high-k dielectric materials. The high-k dielectric materials may be formed of or include at least one of materials (e.g., hafnium oxide (HfO), aluminum oxide (AlO), or tantalum oxide (TaO)) whose dielectric constants are higher than the silicon oxide. Each of the gate spacers GSP and the gate capping pattern CAP may be formed of or include at least one of silicon oxide, silicon nitride, or silicon oxynitride.

A first interlayered insulating layer 160 may be disposed on the substrate 100 to cover the gate structures GS and the active fin AF. The first interlayered insulating layer 160 may cover the exposed side surfaces of the active fin AF and the top surfaces of the device isolation patterns ST. The first interlayered insulating layer 160 may be formed of or include at least one of silicon oxide, silicon nitride, silicon oxynitride, or low-k dielectric materials. A top surface of the gate capping pattern CAP of each of the gate structures GS may be substantially coplanar with a top surface of the first interlayered insulating layer 160. The gate spacers GSP of each of the gate structures GS may be interposed between the gate capping pattern CAP and the first interlayered insulating layer 160.

A second interlayered insulating layer 165 may be disposed on the first interlayered insulating layer 160. The second interlayered insulating layer 165 may be formed of or include at least one of silicon oxide, silicon nitride, silicon oxynitride, or low-k dielectric materials. The second interlayered insulating layer 165 may cover the top surface of the gate capping pattern CAP of each of the gate structures GS.

Contact plugs 170 may be disposed in the first interlayered insulating layer 160 and may be extended into the second interlayered insulating layer 165. Each of the contact plugs 170 may include a conductive pattern 172 penetrating the first and second interlayered insulating layers 160 and 165 and a barrier pattern 174 covering side and bottom surfaces of the conductive pattern 172. In an embodiment, the conductive pattern 172 may be formed of or include at least one of metallic materials, and the barrier pattern 174 may be formed of or include at least one of conductive metal nitrides. Top surfaces of the contact plugs 170 may be located at substantially the same height as the top surface of the second interlayered insulating layer 165. Each of the contact plugs 170 may be provided to penetrate the first and second interlayered insulating layers 160 and 165 and may be connected to a corresponding one of the connection doped region 140, the first doped regions 112, the second doped regions 122, and the third doped regions 132.

The contact plugs 170 may include first contact plugs 170a, which are respectively connected to the connection doped region 140 and the first doped regions 112, and second contact plugs 170b, which are respectively connected to the second doped regions 122 and the third doped regions 132.

One of the first contact plugs 170a may be disposed between the gate structures GS and may be connected to the connection doped region 140. The others of the first contact plugs 170a may be spaced apart from each other, in the first direction D1, with the gate structures GS interposed therebetween, and may be respectively connected to the first doped regions 112. The first contact plugs 170a and the gate structures GS may be alternatingly disposed in the first direction D1. In an embodiment, each of the first contact plugs 170a may be a bar-shaped pattern extending in the second direction D2 and crossing the active fins AF. In this case, the one of the first contact plugs 170a may connect the connection doped regions 140, which are adjacent to each other in the second direction D2, to each other, and each of the others of the first contact plugs 170a may connect the first doped regions 112, which are adjacent to each other in the second direction D2, to each other. Each of the first well regions 110 may be connected to a corresponding one of the first contact plugs 170a through a corresponding one of the first doped regions 112.

In an embodiment, each of the second contact plugs 170b may be a bar-shaped structure extending in the second direction D2 and may be provided to cross a plurality of active fins AF. In this case, one of the second contact plugs 170b may connect a plurality of the second doped regions 122, which are adjacent to each other in the second direction D2, to each other, and another of the second contact plugs 170b may connect a plurality of the third doped regions 132, which are adjacent to each other in the second direction D2, to each other. Each of the second well regions 120 may be connected to a corresponding one of the second contact plugs 170b through each of the second doped regions 122. The substrate 100 may be connected to corresponding ones of the second contact plugs 170b through the third doped regions 132. In an embodiment, the second well regions 120 may be omitted, and in this case, the substrate 100 may be connected to the second contact plugs 170b through the second doped regions 122 and the third doped regions 132.

A third interlayered insulating layer 180 may be disposed on the second interlayered insulating layer 165 to cover the top surfaces of the contact plugs 170. The third interlayered insulating layer 180 may be formed of or include at least one of silicon oxide, silicon nitride, silicon oxynitride, or low-k dielectric materials. Vias 185 may be disposed in the third interlayered insulating layer 180 and may be connected to the contact plugs 170, respectively. Interconnection lines 190 may be disposed on the third interlayered insulating layer 180. The first contact plugs 170a may be connected to a corresponding one of the interconnection lines 190 through the corresponding vias 185 and may be connected to a pad PAD (or, a pin) through the corresponding interconnection line 190. The semiconductor device may be electrically connected to an external device (e.g., a central processing unit (CPU) or a memory controller) through the pad PAD. The semiconductor device may receive a signal including a command CMD and/or an address ADDR from the external device through the pad PAD. The second contact plugs 170b may be connected to a corresponding one of the interconnection lines 190 through the corresponding vias 185 and may be connected to a ground electrode Vss through the corresponding interconnection line 190.

The first well regions 110, the first doped regions 112, the connection doped region 140, and the first contact plugs 170a may constitute a collector of a lateral bipolar junction transistor. The second well regions 120, the second doped regions 122, the third doped regions 132, and the second contact plugs 170b may constitute an emitter of the lateral bipolar junction transistor. The lateral bipolar junction transistor may be an electrostatic discharge (ESD) protection device (or, ESD protection circuit), which is used to protect integrated circuits on the substrate 100 from an electrostatic discharge (ESD) phenomenon. An ESD current I, which may be supplied from the pad PAD during operations of the lateral bipolar junction transistor, may be discharged to the ground electrode Vss through the lateral bipolar junction transistor. In an embodiment, the second well regions 120 may be omitted, and in this case, the second doped regions 122, the third doped regions 132, and the second contact plugs 170b may constitute the emitter of the lateral bipolar junction transistor.

In an embodiment, the connection doped region 140 may constitute a direct PN junction, along with the substrate 100 between the first well regions 110. In this case, a large fraction of the ESD current I may be discharged through the PN junction structure, which is composed of the connection doped region 140 and the substrate 100, rather than through a PN junction structure, which is composed of the first doped region 112, the first well region 110, and the substrate 100, and thus, it may be possible to lower a trigger voltage for the operation of the lateral bipolar junction transistor.

The first well regions 110 may be extended into the substrate 100 to have a depth deeper than the connection doped region 140. In this case, a discharging path of the ESD current I may be formed at a position that is spaced apart from the first doped regions 112 adjacent to the connection doped region 140, and thus, a leakage current between the collector and emitter of the lateral bipolar junction transistor may be reduced.

Furthermore, the active fin AF and the gate structures GS may have a structure similar to those of the fin field effect transistor. Accordingly, the lateral bipolar junction transistor may have a structure that is easily integrated along with a field effect transistor of a three-dimensional channel structure.

Thus, it may be possible to provide a highly-reliable ESD protection device whose structure is easily integrated along with a field effect transistor of a three-dimensional channel structure.

Figure 4:
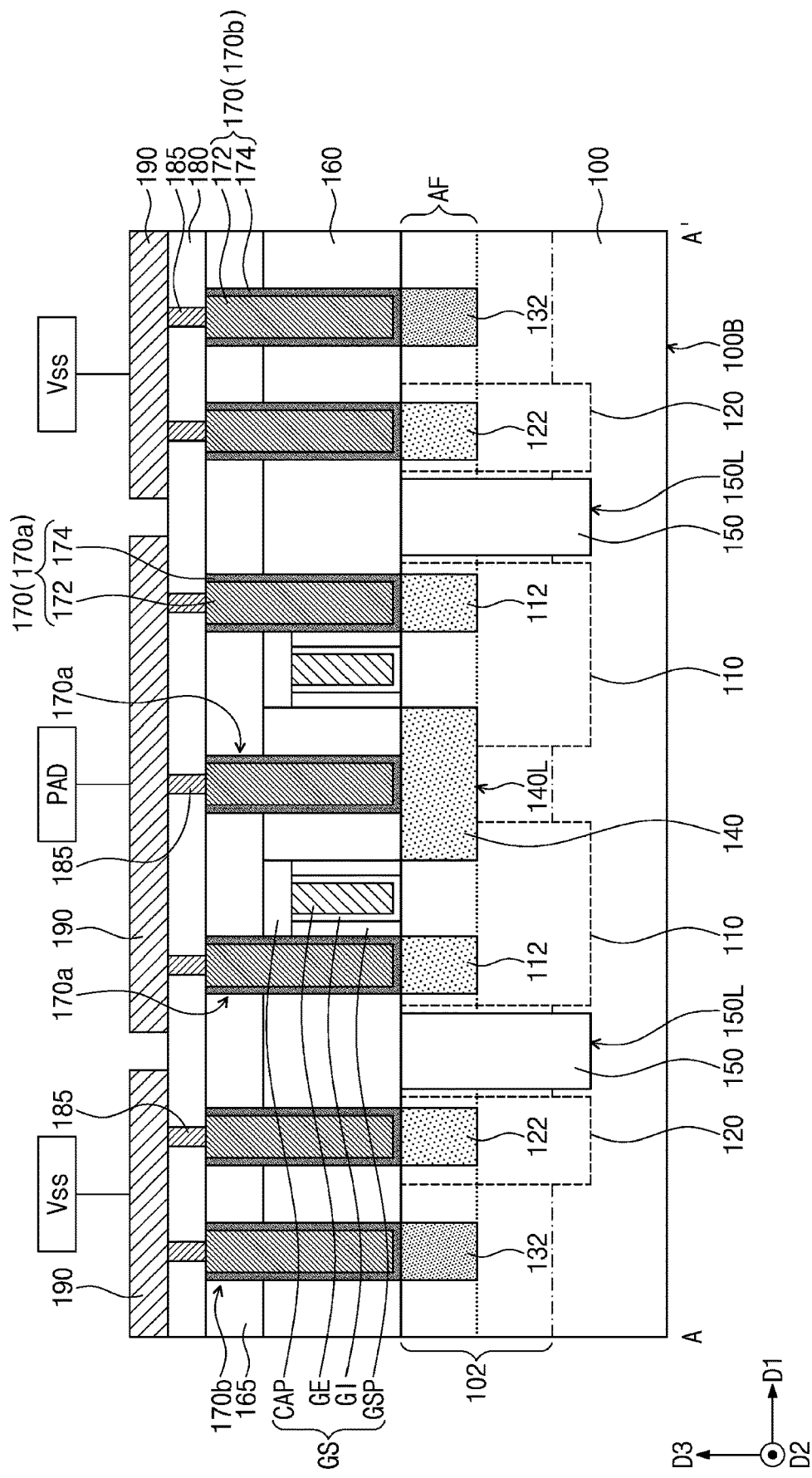
FIG. 4 is a sectional view illustrating a semiconductor device according to an embodiment of the inventive concept, taken along the line A-A' of FIG. 1.

FIG. 4 is a sectional view illustrating a semiconductor device according to an embodiment of the inventive concept, taken along the line A-A' of FIG. 1. For concise description, the description that follows will mainly refer to technical features, which are different from those in the semiconductor device described with reference to FIGS. 1 to 3.

Referring to FIGS. 1 and 4, the insulating pattern 150 may be disposed between each of the first doped regions 112 and each of the second doped regions 122. The insulating pattern 150 may be disposed in the active fin AF and may be extended into the substrate 100 between each of the first well regions 110 and each of the second well regions 120. The insulating pattern 150 may be extended in the second direction D2 to cross the active fins AF. In an embodiment, a height of the bottommost surface 150L of the insulating pattern 150 may be lower than a height of the bottommost surface 140L of the connection doped region 140. In certain embodiments, the height of the bottommost surface 150L of the insulating pattern 150 may be substantially equal to bottommost surfaces of the first well regions 110 and the second well regions 120. The insulating pattern 150 may be formed of or include at least one of oxide, nitride, and/or oxynitride.

According to the present embodiments, the insulating pattern 150 may be extended from a region between the active fins AF into the substrate 100. In this case, the ESD protection device may have high reliability, even when an amount of the ESD current I supplied from the pad PAD is increased.

Figure 5:
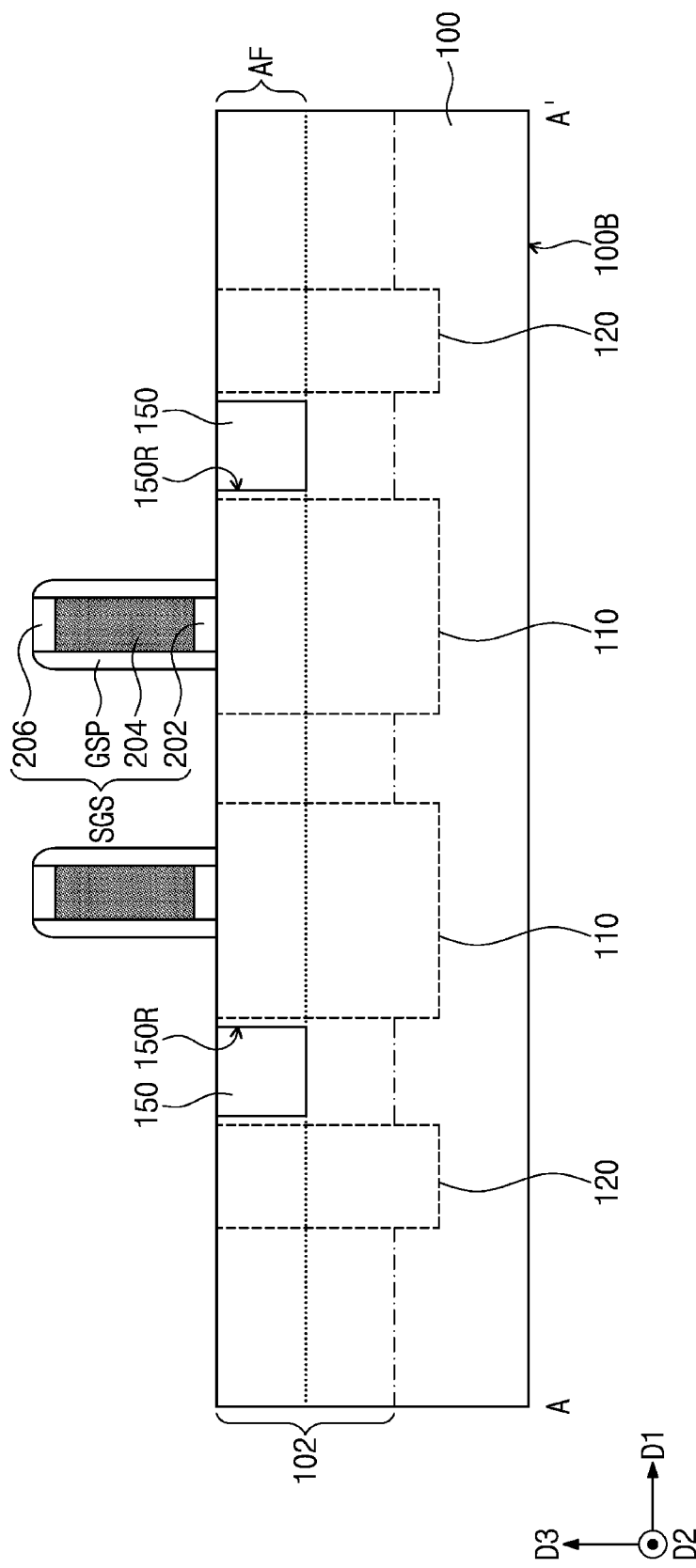
FIGS. 5 to 10 are sectional views illustrating a method of fabricating a semiconductor device, according to an embodiment of the inventive concept.
Figure 6:
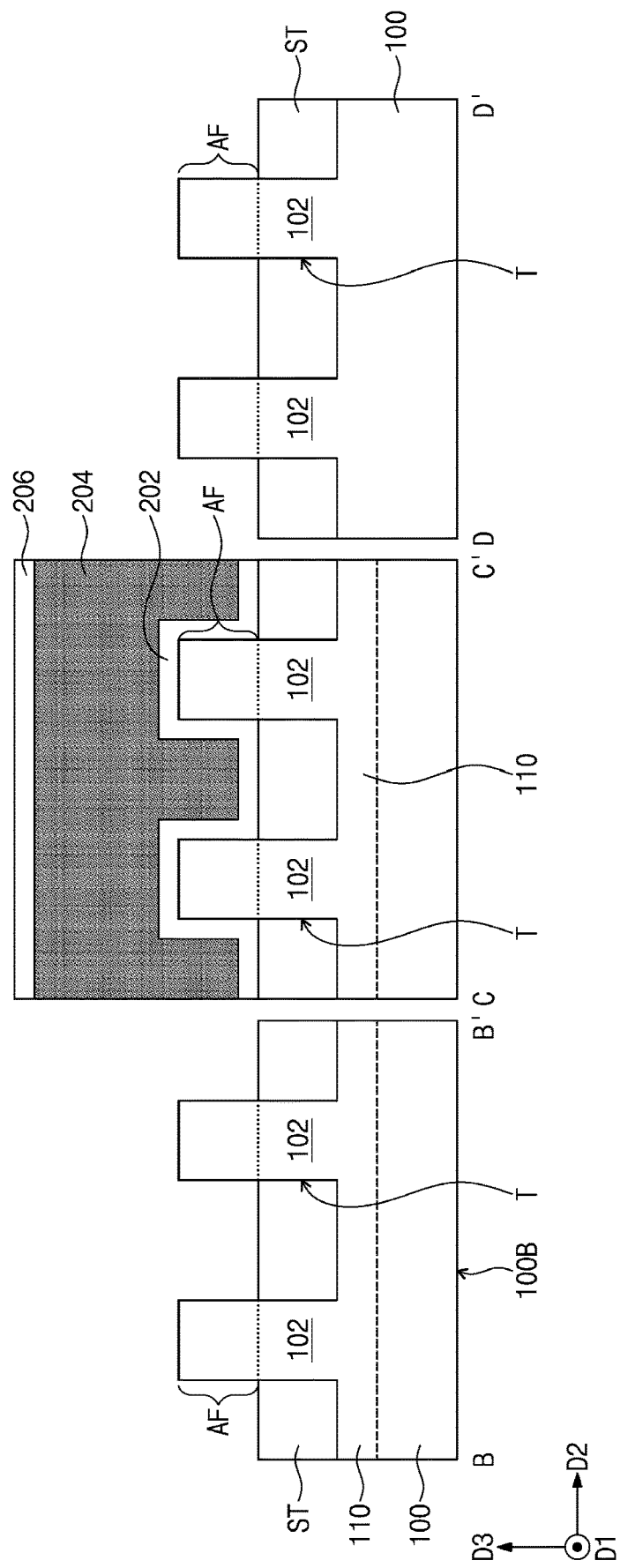
Figure 7:
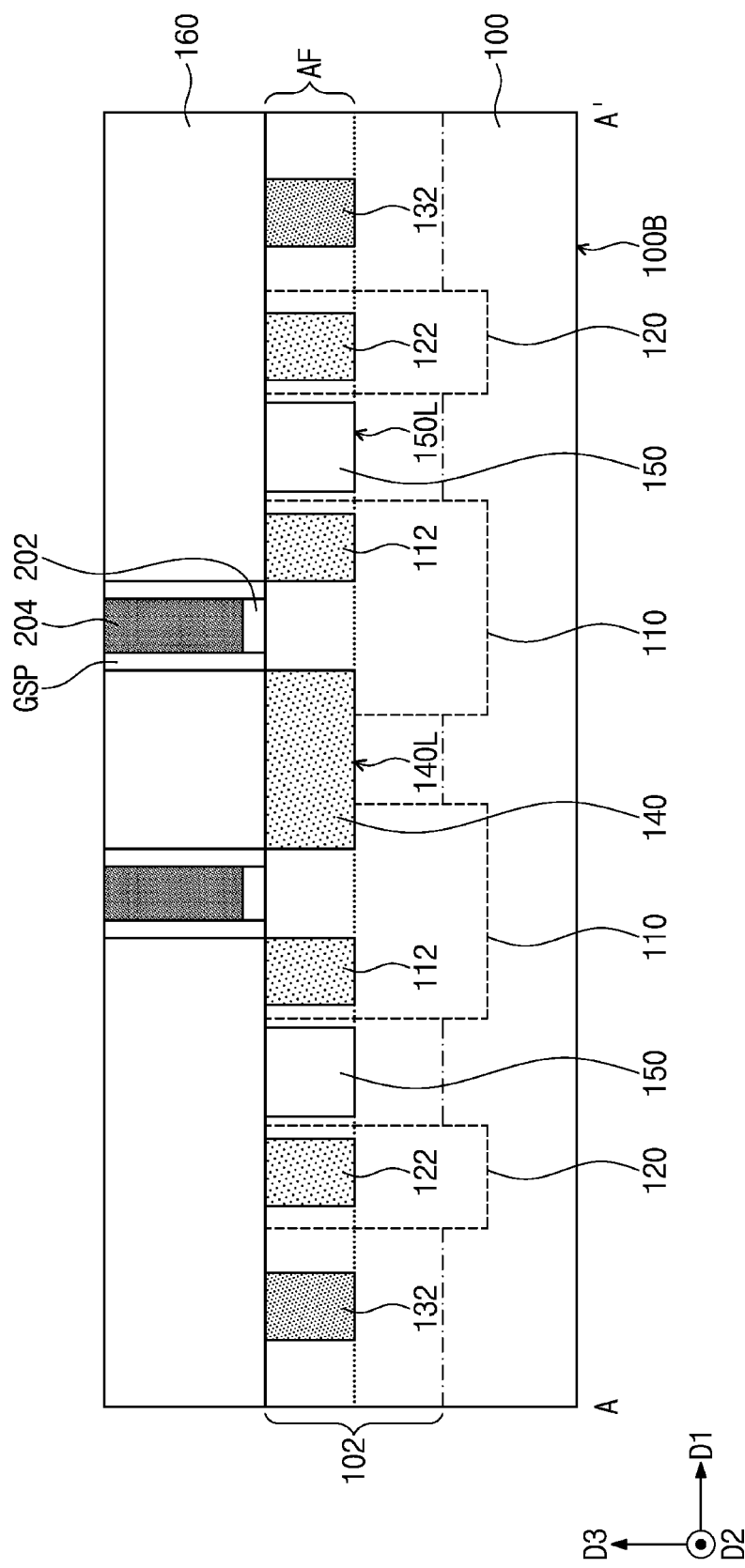
Figure 8:
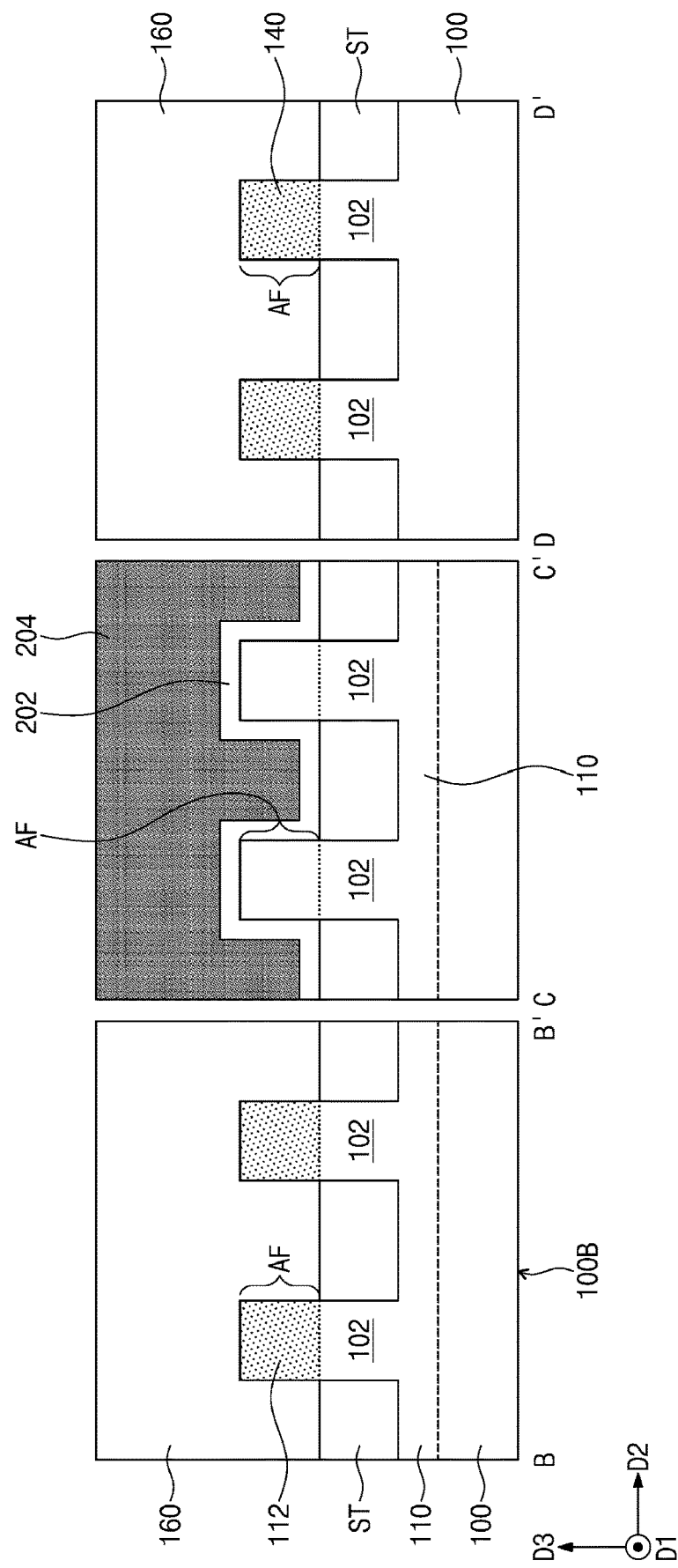
Figure 9:
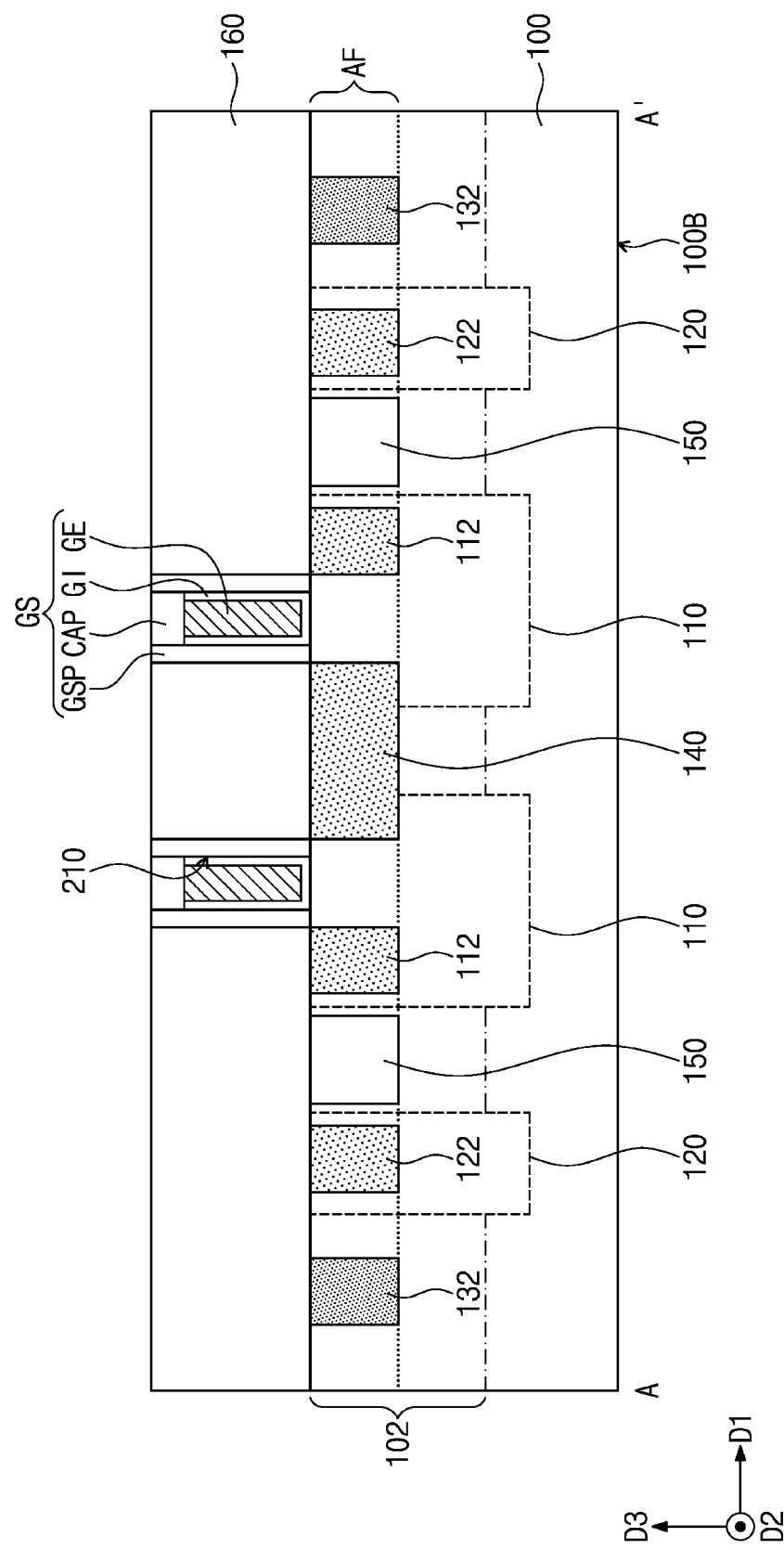

FIGS. 5 to 10 are sectional views illustrating a method of fabricating a semiconductor device, according to an embodiment of the inventive concept. For example, FIGS. 5, 7, and 9 are sectional views, each of which is taken along the line A-A' of FIG. 1, and FIGS. 6, 8, and 10 are sectional views, each of which is taken along the lines B-B', C-C', and D-D' of FIG. 1. For concise description, the description that follows will mainly refer to technical features, which are different from those in the semiconductor device described with reference to FIGS. 1 to 4.

Referring to FIGS. 1, 5, and 6, the first well regions 110 and the second well regions 120 may be formed in the substrate 100. The first well regions 110 may be spaced apart from each other in the first direction D1 and may be extended in the second direction D2 crossing the first direction D1. The second well regions 120 may be spaced apart from each other in the first direction D1 with the first well regions 110 interposed therebetween and may be extended in the second direction D2. The first well regions 110 and the second well regions 120 may be formed by injecting impurities of the first conductivity type into the substrate 100. The substrate 100 may have the second conductivity type that is different from the first conductivity type. In an embodiment, the formation of the second well regions 120 may be omitted.

The active patterns 102 may be formed in the substrate 100. The formation of the active patterns 102 may include patterning an upper portion of the substrate 100 to form trenches T defining the active patterns 102 in the substrate 100. The trenches T may be extended in the first direction D1 to cross the first well regions 110 and the second well regions 120 and may be spaced apart from each other in the second direction D2. The active patterns 102 may protrude from the substrate 100 in the third direction D3, which is perpendicular to the bottom surface 100B of the substrate 100. The active patterns 102 may be extended in the first direction D1 and may be spaced apart from each other in the second direction D2. Each of the active patterns 102 may include the first well regions 110 and the second well regions 120.

The device isolation patterns ST may be formed in the substrate 100. The formation of the device isolation patterns ST may include forming a device isolation layer to fill the trenches T and recessing the device isolation layer to expose upper portions of the active patterns 102. As a result of the recessing of the device isolation layer, each of the active patterns 102 may include an upper portion (hereinafter, the active fin AF) exposed by the device isolation patterns ST.

The insulating pattern 150 may be formed in the active fin AF to cross the active fin AF. The insulating pattern 150 may be extended in the second direction D2 to cross the active fins AF. In an embodiment, the formation of the insulating pattern 150 may include removing a portion of the active fin AF to form an empty region 150R in the active fin AF, forming an insulating layer to fill the empty region 150R, and planarizing the insulating layer to expose a top surface of the active fin AF. In another embodiment, the insulating pattern 150 may be formed to extend from a region between the active fins AF into the substrate 100, as described with reference to FIG. 4. In this case, the empty region 150R may be formed by removing a portion of the active fin AF and an upper portion (e.g., at least a portion of the corresponding active pattern 102) of the substrate 100.

Sacrificial gate structures SGS may be formed on the substrate 100 to cross the active fin AF. The sacrificial gate structures SGS may be extended in the second direction D2 and may be spaced apart from each other in the first direction D1. The sacrificial gate structures SGS may be formed on the first well regions 110, respectively.

Each of the sacrificial gate structures SGS may include an etch stop pattern 202, a sacrificial gate pattern 204, and a gate mask pattern 206, which are sequentially stacked on the substrate 100. The sacrificial gate pattern 204 may be extended in the second direction D2 to cross the active fin AF. The sacrificial gate pattern 204 may be formed to cover top and side surfaces of the active fin AF and may be extended to cover top surfaces of the device isolation patterns ST. The etch stop pattern 202 may be interposed between the sacrificial gate pattern 204 and the top and side surfaces of the active fin AF and between the sacrificial gate pattern 204 and the top surfaces of the device isolation patterns ST. The gate mask pattern 206 may be extended along a top surface of the sacrificial gate pattern 204.

The formation of the sacrificial gate pattern 204 and the etch stop pattern 202 may include sequentially forming an etch stop layer (not shown) and a sacrificial gate layer (not shown) on the substrate 100, forming the gate mask pattern 206, which defines a position and a shape of the sacrificial gate pattern 204, on the sacrificial gate layer, and sequentially patterning the sacrificial gate layer and the etch stop layer using the gate mask pattern 206 as an etch mask. The etch stop layer may be formed of or include, for example, silicon oxide. The sacrificial gate layer may include a material having an etch selectivity with respect to the etch stop layer. For example, the sacrificial gate layer may be formed of or include poly silicon. The sacrificial gate pattern 204 may be formed by patterning the sacrificial gate layer using the gate mask pattern 206 as an etch mask. The patterning of the sacrificial gate layer may include performing an etching process using an etch recipe that is selected to have an etch selectivity with respect to the etch stop layer. After the formation of the sacrificial gate pattern 204, portions of the etch stop layer, which are located at both sides of the sacrificial gate pattern 204, may be removed to locally form the etch stop pattern 202 below the sacrificial gate pattern 204.

Each of the sacrificial gate structures SGS may further include the gate spacers GSP, which are provided at both sides of the sacrificial gate pattern 204. The formation of the gate spacers GSP may include forming a gate spacer layer (not shown) on the substrate 100 to cover the gate mask pattern 206, the sacrificial gate pattern 204, and the etch stop pattern 202 and then anisotropically etching the gate spacer layer. The gate mask pattern 206 and the gate spacers GSP may be formed of or include, for example, silicon nitride.

Referring to FIGS. 1, 7, and 8, the connection doped region 140 may be formed in the active fin AF between the sacrificial gate structures SGS. In an embodiment, the formation of the connection doped region 140 may include injecting impurities of the first conductivity type into the active fin AF between the sacrificial gate structures SGS. In another embodiment, the formation of the connection doped region 140 may include removing a portion of the active fin AF between the sacrificial gate structures SGS to expose a top surface of a corresponding active pattern 102, performing a selective epitaxial growth process, in which the exposed top surface of the corresponding active pattern 102 is used as a seed layer, to form an epitaxial pattern, and injecting impurities of the first conductivity type into the epitaxial pattern, and here, the injection of the impurities may be performed during or after the selective epitaxial growth process. A concentration of impurities in the connection doped region 140 may be higher than that in the first well regions 110.

The first doped regions 112 may be formed in the active fin AF and in the first well regions 110, respectively. The first doped regions 112 may be connected to the first well regions 110, respectively. In an embodiment, the formation of the first doped regions 112 may include injecting impurities of the first conductivity type into the active fin AF in the first well regions 110. In another embodiment, the formation of the first doped regions 112 may include removing portions of the active fin AF in the first well regions 110 to expose top surfaces of the corresponding active pattern 102, performing a selective epitaxial growth process, in which the exposed top surfaces of the corresponding active pattern 102 is used as a seed layer, to form epitaxial patterns, and injecting impurities of the first conductivity type into the epitaxial patterns, and here, the injection of the impurities may be performed during or after the selective epitaxial growth process. A concentration of impurities in the first doped regions 112 may be higher than that in the first well regions 110.

The second doped regions 122 may be formed in the active fin AF and in the second well regions 120, respectively. The second doped regions 122 may be connected to the second well regions 120, respectively. In an embodiment, the formation of the second doped regions 122 may include injecting impurities of the first conductivity type into the active fin AF in the second well regions 120. In another embodiment, the formation of the second doped regions 122 may include removing portions of the active fin AF in the second well regions 120 to expose top surfaces of the corresponding active pattern 102, performing a selective epitaxial growth process, in which the exposed top surfaces of the corresponding active pattern 102 is used as a seed layer, to form epitaxial patterns, and injecting impurities of the first conductivity type into the epitaxial patterns, and here, the injection of the impurities may be performed during or after the selective epitaxial growth process. A concentration of impurities in the second doped regions 122 may be higher than a concentration of impurities in the second well regions 120.

The third doped regions 132 may be formed in the active fin AF. The third doped regions 132 may be spaced apart from each other in the first direction D1, and the connection doped region 140, the first doped regions 112, and the second doped regions 122 may be interposed between the third doped regions 132. In an embodiment, the formation of the third doped regions 132 may include injecting impurities of the second conductivity type into the active fin AF. A concentration of the impurities in each of the third doped regions 132 may be higher than that in the substrate 100. In another embodiment, the formation of the third doped regions 132 may include removing portions of the active fin AF to expose top surfaces of the corresponding active pattern 102, performing a selective epitaxial growth process, in which the exposed top surfaces of the corresponding active pattern 102 is used as a seed layer, to form epitaxial patterns, and injecting impurities of the second conductivity type into the epitaxial patterns, and here, the injection of the impurities may be performed during or after the selective epitaxial growth process.

In an embodiment, each of the connection doped region 140 and the first to third doped regions 112, 122, and 132 may be locally formed in the active fin AF, but the inventive concept is not limited to this example. In another embodiment, each of the connection doped region 140 and the first to third doped regions 112, 122, and 132 may be formed to extend into the corresponding active pattern 102 below the active fin AF, unlike that illustrated in the drawings.

The first interlayered insulating layer 160 may be formed on the substrate 100 to cover the sacrificial gate structures SGS and the active fin AF. The first interlayered insulating layer 160 may be formed to cover the connection doped region 140, the first to third doped regions 112, 122, and 132, and the insulating pattern 150. The first interlayered insulating layer 160 may be planarized until the sacrificial gate pattern 204 is exposed. The gate mask pattern 206 may be removed by the planarization process.

Figure 10:
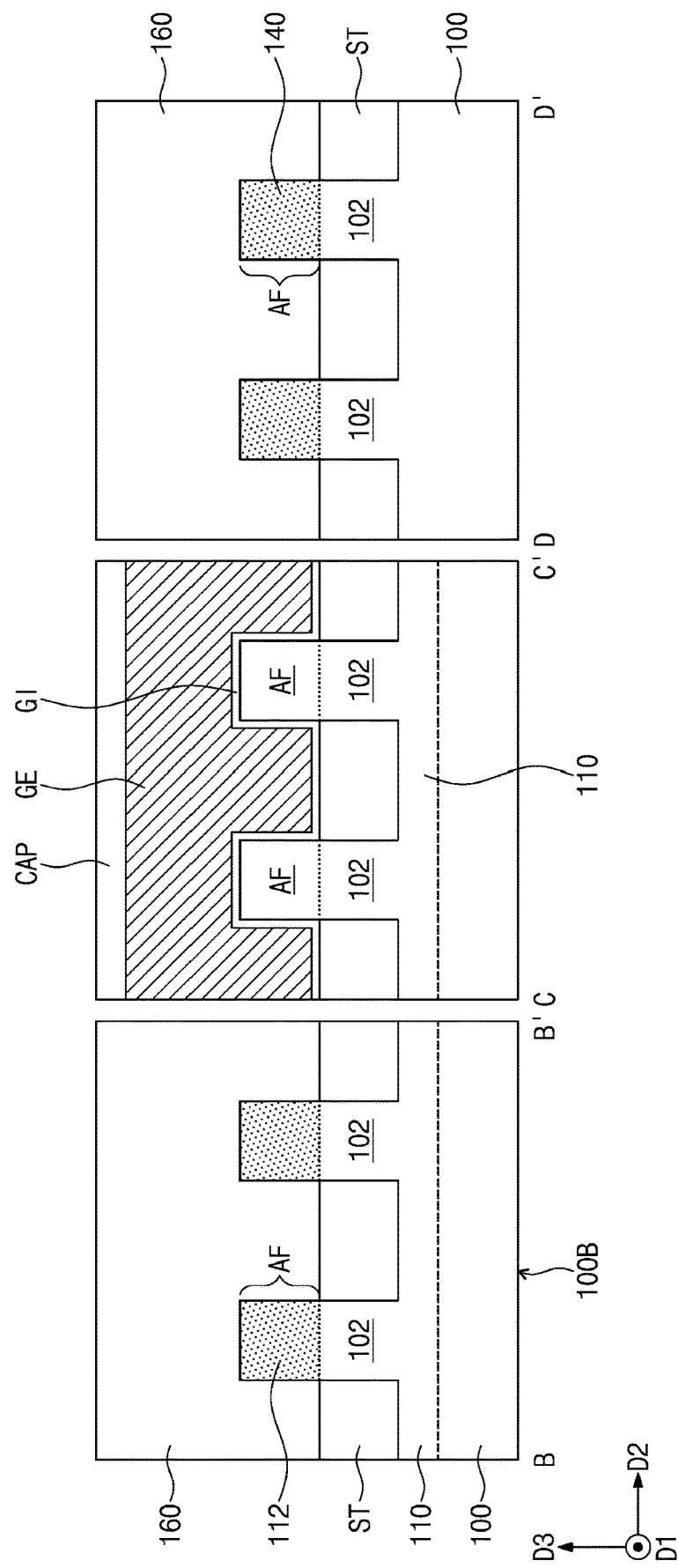

Referring to FIGS. 1, 9, and 10, the sacrificial gate pattern 204 and the etch stop pattern 202 may be removed, and thus, gap regions 210 may be formed in the first interlayered insulating layer 160. Each of the gap regions 210 may be an empty region between the gate spacers GSP. Each of the gap regions 210 may be formed to expose the active fin AF. The formation of the gap regions 210 may include selectively etching the sacrificial gate pattern 204 using an etch recipe, which has an etch selectivity with respect to the gate spacers GSP, the first interlayered insulating layer 160, and the etch stop pattern 202, and then removing the etch stop pattern 202 to expose the active fin AF.

The gate insulating pattern GI and the gate electrode GE may be formed to fill each of the gap regions 210. The formation of the gate insulating pattern GI and the gate electrode GE may include forming a gate insulating layer to conformally cover an inner surface of each of the gap regions 210, forming a gate conductive layer to fill a remaining region of each of the gap regions 210, and performing a planarization process to expose the first interlayered insulating layer 160 and locally form the gate insulating pattern GI and the gate electrode GE in each of the gap regions 210. In an embodiment, upper portions of the gate insulating pattern GI and the gate electrode GE may be recessed to form a groove region between the gate spacers GSP. The gate capping pattern CAP may be formed in the groove region. The formation of the gate capping pattern CAP may include forming a gate capping layer on the first interlayered insulating layer 160 to fill the groove region and then planarizing the gate capping layer to expose the first interlayered insulating layer 160. The gate insulating pattern GI, the gate electrode GE, the gate capping pattern CAP, and the gate spacers GSP may constitute the gate structure GS.

Referring back to FIGS. 1 to 3, the second interlayered insulating layer 165 may be formed on the first interlayered insulating layer 160. The contact plugs 170 may be formed in the first and second interlayered insulating layers 160 and 165. Each of the contact plugs 170 may include the conductive pattern 172, which is formed to penetrate the first and second interlayered insulating layers 160 and 165, and the barrier pattern 174, which is formed to cover side and bottom surfaces of the conductive pattern 172. In an embodiment, the formation of the contact plugs 170 may include forming contact holes to penetrate the first and second interlayered insulating layers 160 and 165, forming a barrier layer to partially fill each of the contact holes, forming a conductive layer to fill a remaining region of each of the contact holes, and planarizing the conductive layer and the barrier layer to expose the second interlayered insulating layer 165. As a result of the planarization process, the conductive pattern 172 and the barrier pattern 174 may be locally formed in each of the contact holes. Each of the contact plugs 170 may be provided to penetrate the first and second interlayered insulating layers 160 and 165 and may be connected to a corresponding one of the connection doped region 140, the first doped regions 112, the second doped regions 122, and the third doped regions 132.

The third interlayered insulating layer 180 may be formed on the second interlayered insulating layer 165 to cover top surfaces of the contact plugs 170. The vias 185 may be formed in the third interlayered insulating layer 180. Each of the vias 185 may be provided to penetrate the third interlayered insulating layer 180 and may be connected to a corresponding one of the contact plugs 170. The interconnection lines 190 may be formed on the third interlayered insulating layer 180 and may be connected to corresponding ones of the vias 185. Although not shown, each of the interconnection lines 190 may be connected to the pad PAD or the ground electrode Vss through an additional interconnection structure.

Figure 11:
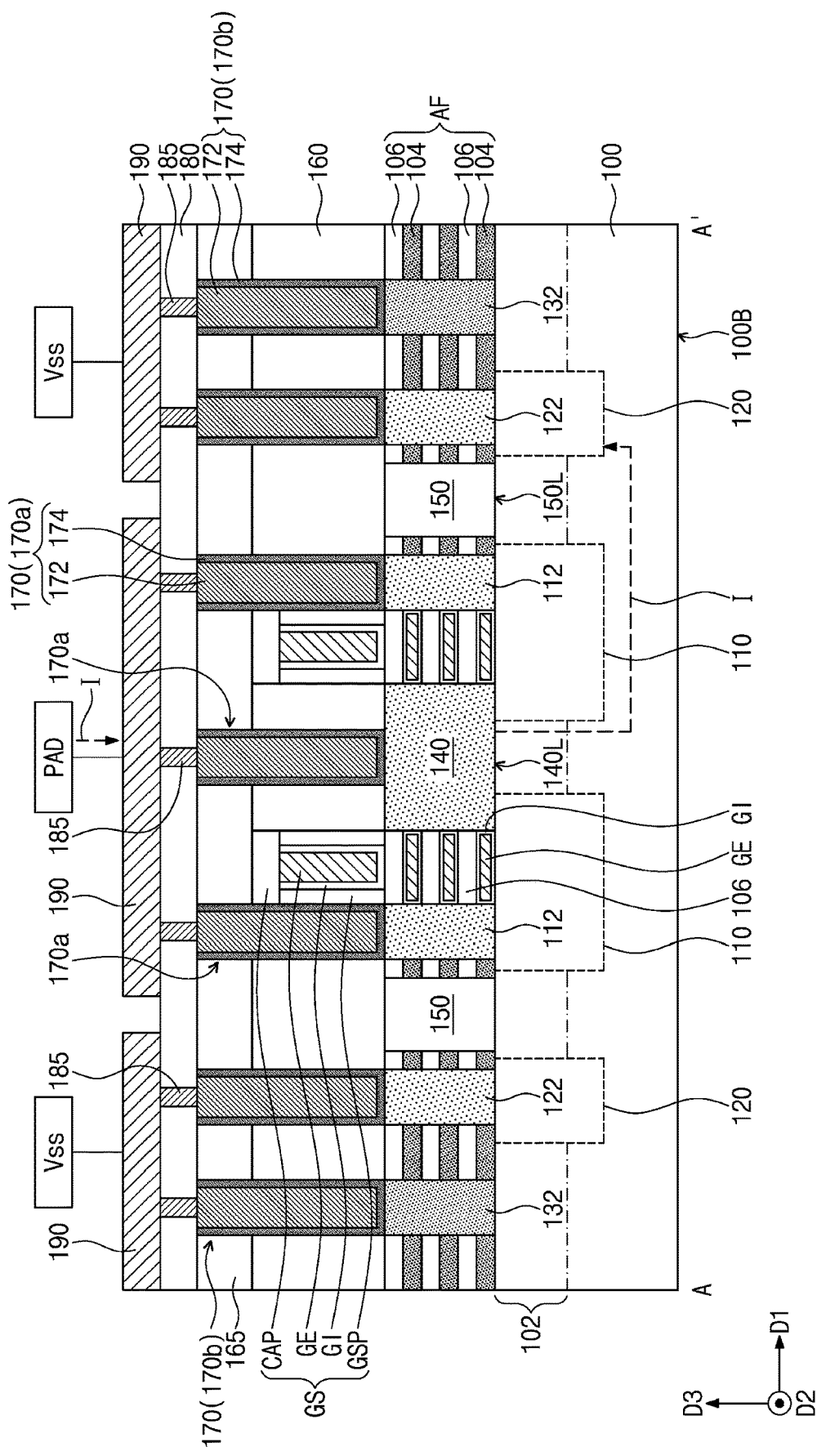
FIG. 11 is a sectional view illustrating a semiconductor device according to an embodiment of the inventive concept, taken along the line A-A' of FIG. 1.
Figure 12:
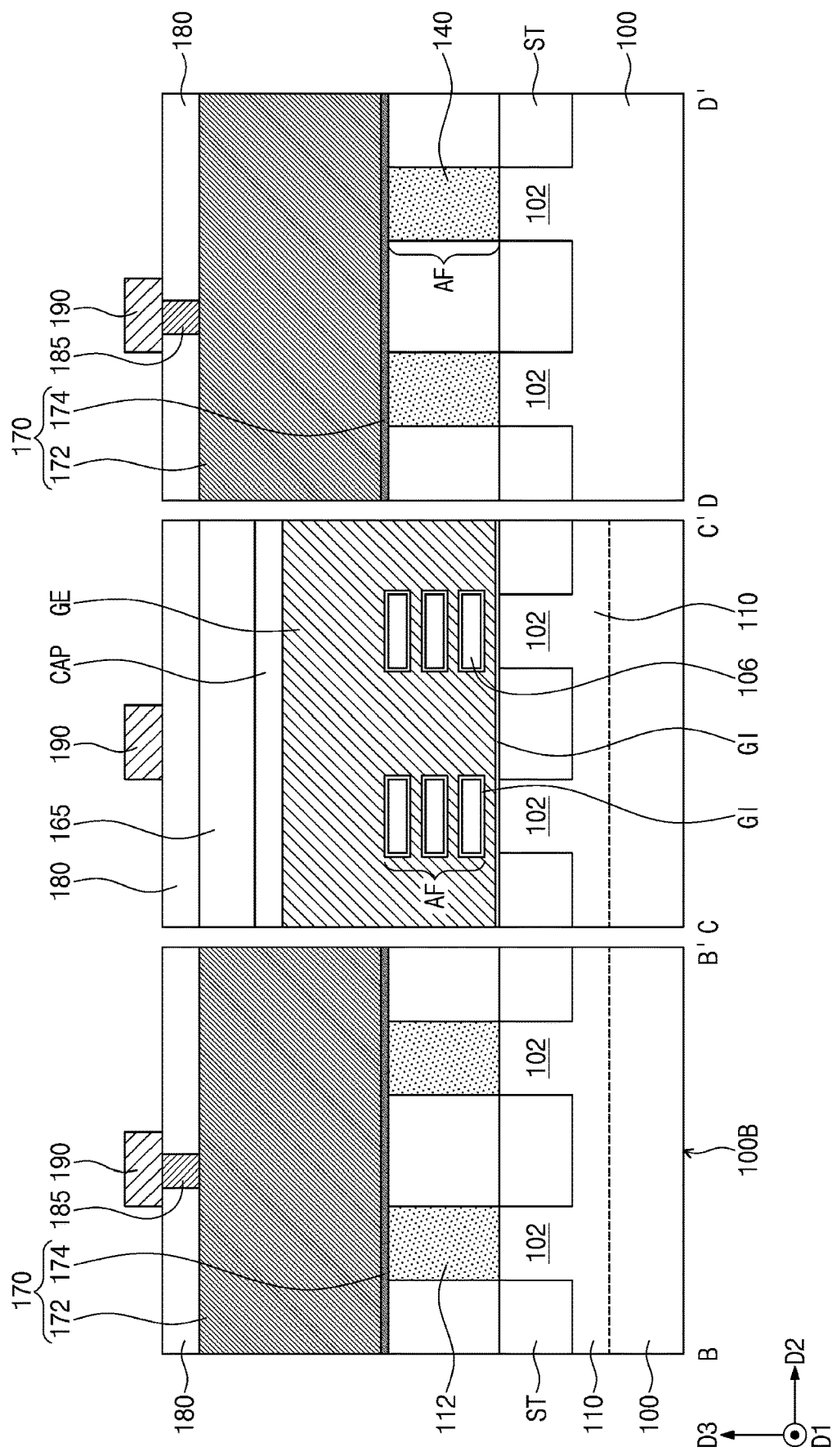
FIG. 12 is a sectional view illustrating a semiconductor device according to an embodiment of the inventive concept, taken along the lines B-B', C-C', and D-D' of FIG. 1.

FIG. 11 is a sectional view illustrating a semiconductor device according to an embodiment of the inventive concept, taken along the line A-A' of FIG. 1. FIG. 12 is a sectional view illustrating a semiconductor device according to an embodiment of the inventive concept, taken along the lines B-B', C-C', and D-D' of FIG. 1. For concise description, the description that follows will mainly refer to technical features, which are different from those in the semiconductor device described with reference to FIGS. 1 to 4.

Referring to FIGS. 1, 11, and 12, the first well regions 110 and the second well regions 120 may be disposed in the substrate 100. The first well regions 110 may be spaced apart from each other in the first direction D1 and may be extended in the second direction D2. The second well regions 120 may be spaced apart from each other in the first direction D1 with the first well regions 110 interposed therebetween and may be extended in the second direction D2. The first well regions 110 and the second well regions 120 may include impurities of the first conductivity type, and the substrate 100 may have a second conductivity type that is different from the first conductivity type. In an embodiment, the second well regions 120 may be omitted.

The device isolation patterns ST may be disposed in the substrate 100. The substrate 100 may include the active patterns 102, which are defined by the device isolation patterns ST. The device isolation patterns ST may be extended in the first direction D1 to cross the first well regions 110 and the second well regions 120 and may be spaced apart from each other in the second direction D2. Each of the active patterns 102 may be interposed between corresponding ones of the device isolation patterns ST. Each of the active patterns 102 may include the first well regions 110 and the second well regions 120.

The active fin AF may be disposed on each of the active patterns 102. In an embodiment, the active fin AF may include sacrificial patterns 104 and semiconductor patterns 106, which are alternatingly stacked, in the third direction D3, on each of the active patterns 102. The sacrificial patterns 104 may be formed of or include a material different from the semiconductor patterns 106. For example, the semiconductor patterns 106 may be formed of or include silicon (Si), and the sacrificial patterns 104 may be formed of or include silicon germanium (SiGe).

The connection doped region 140 may be disposed in the active fin AF between the first well regions 110. The connection doped region 140 may penetrate the active fin AF and may be in direct contact with a portion (e.g., a corresponding active pattern 102) of the substrate 100 located between the first well regions 110. In an embodiment, the connection doped region 140 may be an epitaxial pattern, which is grown using the active fin AF and the corresponding active pattern 102 as a seed layer. The connection doped region 140 may be connected to the first well regions 110 and may include impurities of the first conductivity type. A concentration of impurities in the connection doped region 140 may be higher than that in the first well regions 110. The connection doped region 140 may constitute a PN junction, along with the substrate 100 between the first well regions 110.

The first doped regions 112 may be disposed in the active fin AF and on the first well regions 110, respectively. The first doped regions 112 may be connected to the first well regions 110, respectively. The connection doped region 140 may be disposed between the first doped regions 112 and may be spaced apart from the first doped regions 112. Each of the first doped regions 112 may penetrate the active fin AF and may be in contact with a corresponding one of the first well regions 110. Each of the first doped regions 112 may be an epitaxial pattern, which is grown using the active fin AF and the corresponding active pattern 102 as a seed layer. The first doped regions 112 may include impurities of the first conductivity type, and a concentration of impurities in the first doped regions 112 may be higher than that in the first well regions 110.

The second doped regions 122 may be disposed in the active fin AF and on the second well regions 120, respectively. The second doped regions 122 may be connected to the second well regions 120, respectively. The first doped regions 112 may be disposed between the second doped regions 122, and the second doped regions 122 may be spaced apart from each of the first doped regions 112. Each of the second doped regions 122 may penetrate the active fin AF and may be in contact with a corresponding one of the second well regions 120. Each of the second doped regions 122 may be an epitaxial pattern, which is grown using the active fin AF and the corresponding active pattern 102 as a seed layer. The second doped regions 122 may include impurities of the first conductivity type, and a concentration of impurities in the second doped regions 122 may be higher than that in the second well regions 120.

The insulating pattern 150 may be disposed between each of the first doped regions 112 and each of the second doped regions 122. The insulating pattern 150 may be disposed in the active fin AF and may be extended in the second direction D2 to cross a plurality of the active fins AF. In an embodiment, a height of the bottommost surface 150L of the insulating pattern 150 may be substantially equal to a height of the bottommost surface 140L of the connection doped region 140. In another embodiment, as described with reference to FIG. 4, the height of the bottommost surface 150L of the insulating pattern 150 may be lower than the height of the bottommost surface 140L of the connection doped region 140.

The third doped regions 132 may be disposed in the active fin AF. The second doped regions 122 may be disposed between the third doped regions 132, and the third doped regions 132 may be spaced apart from each of the second doped regions 122. Each of the third doped regions 132 may penetrate the active fin AF and may be in contact with the substrate 100 (e.g., the corresponding active pattern 102). Each of the third doped regions 132 may be an epitaxial pattern, which is grown using the active fin AF and the corresponding active pattern 102 as a seed layer. The third doped regions 132 may include impurities of the second conductivity type.

The gate structures GS may be disposed on the substrate 100 to cross the active fin AF. The gate structures GS may be extended in the second direction D2 and may be spaced apart from each other in the first direction D1. The gate structures GS may be disposed on the first well regions 110, respectively. The connection doped region 140 may be disposed in the active fin AF between the gate structures GS. In an embodiment, the gate structures GS may be dummy gate structures, which are in an electrically floating state.

Each of the gate structures GS may include the gate electrode GE, which extends in the second direction D2 to cross the active fin AF, the gate insulating pattern GI between the gate electrode GE and the active fin AF, the gate spacers GSP on side surfaces of the gate electrode GE, and the gate capping pattern CAP on a top surface of the gate electrode GE. The gate electrode GE may cover the top and side surfaces of the active fin AF and may be extended into regions between the semiconductor patterns 106 of the active fin AF and between the active fin AF and the corresponding active pattern 102. The gate insulating pattern GI may be extended into regions between each of the semiconductor patterns 106 and the gate electrode GE and between the corresponding active pattern 102 and the gate electrode GE. The semiconductor patterns 106 may be spaced apart from the gate electrode GE with the gate insulating pattern GI interposed therebetween. The gate insulating pattern GI may be extended to regions between the gate electrode GE and the gate spacers GSP, and the topmost surface of the gate insulating pattern GI may be substantially coplanar with the top surface of the gate electrode GE. In an embodiment, the gate spacers GSP may be extended to cover the side surfaces of the gate capping pattern CAP.

Except for the afore-described differences, the semiconductor device according to the present embodiment may be substantially the same as the semiconductor device described with reference to FIGS. 1 to 4.

According to the present embodiment, the active fin AF and the gate structures GS may have a structure similar to that of the multi-bridge channel field effect transistor. Accordingly, the lateral bipolar junction transistor may have a structure that is easily integrated along with a field effect transistor whose channel region has a three-dimensional structure.

Figure 13:
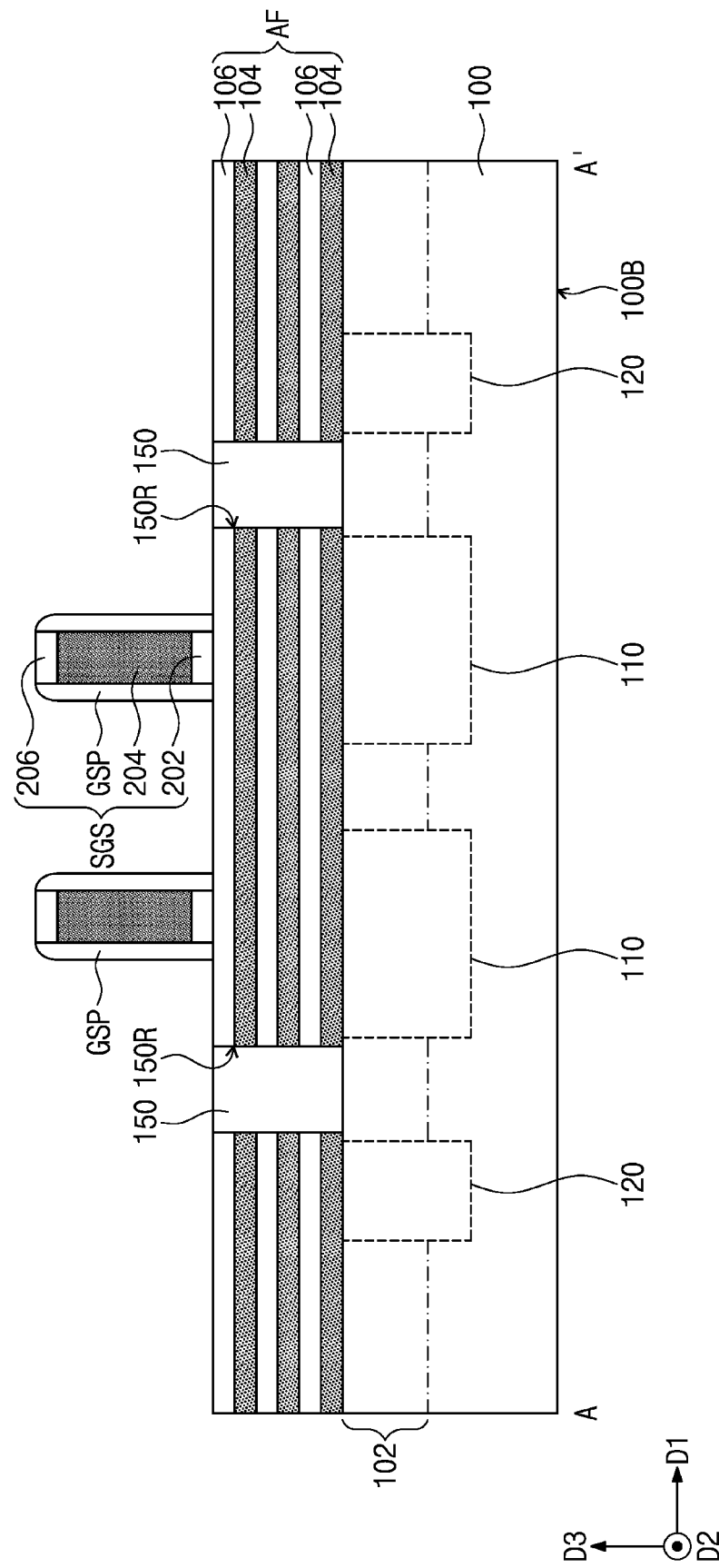
FIGS. 13 to 18 are sectional views illustrating a method of fabricating a semiconductor device, according to an embodiment of the inventive concept.
Figure 14:
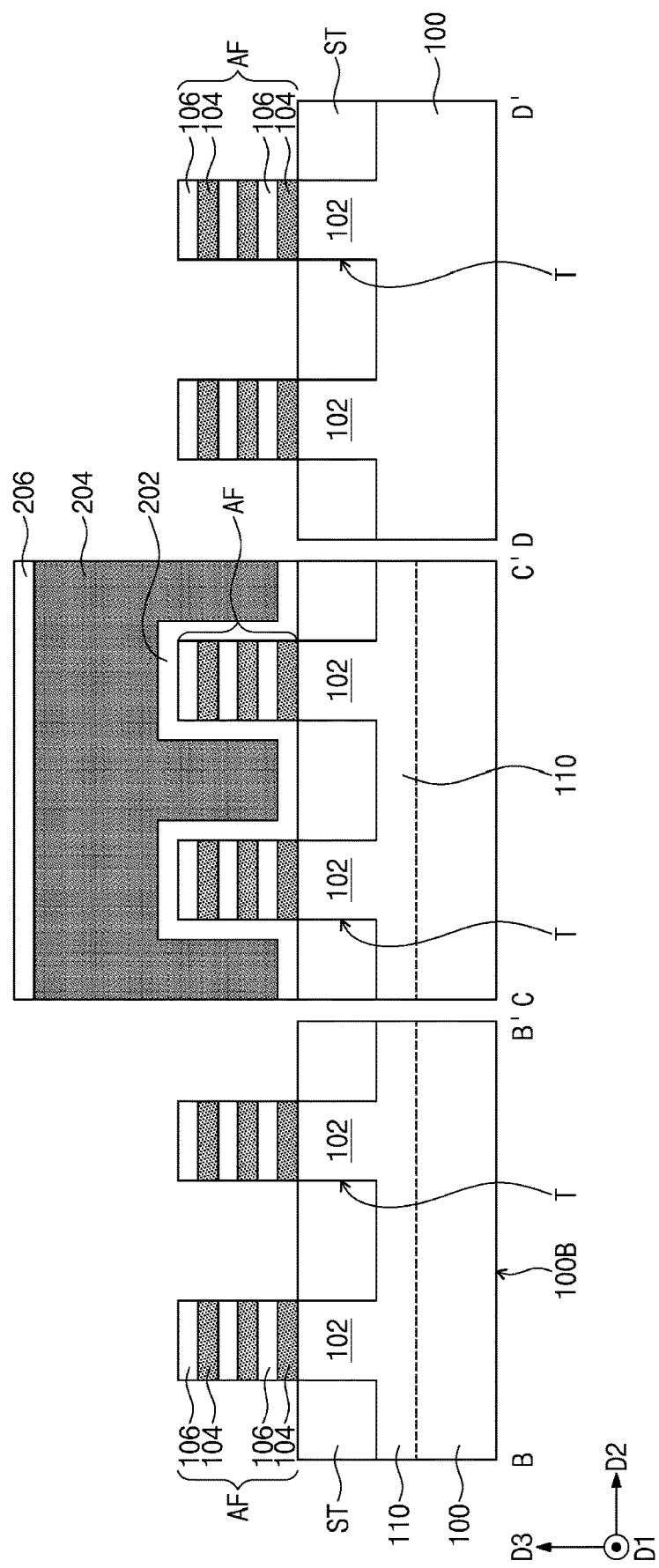
Figure 15:
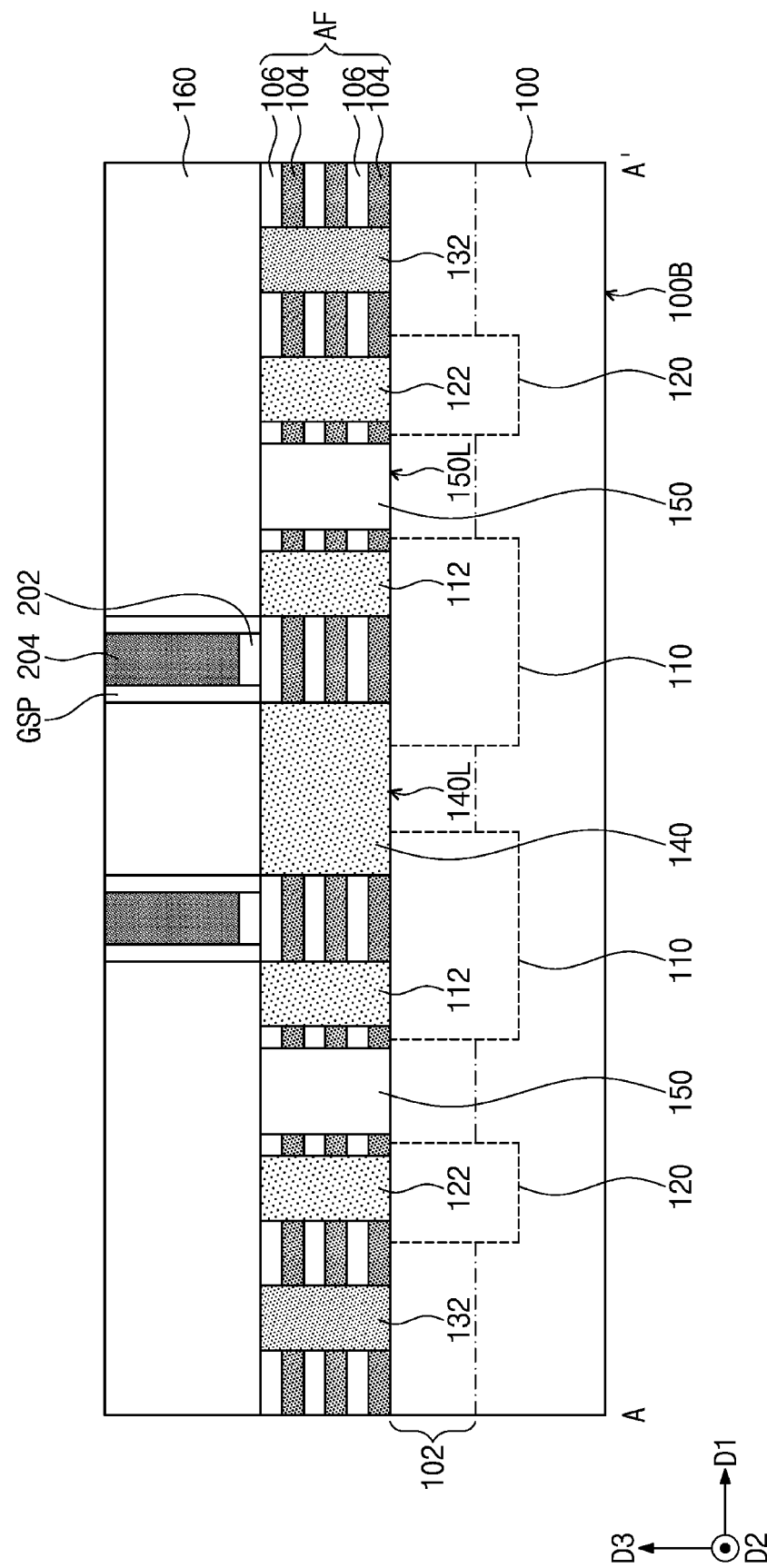
Figure 16:
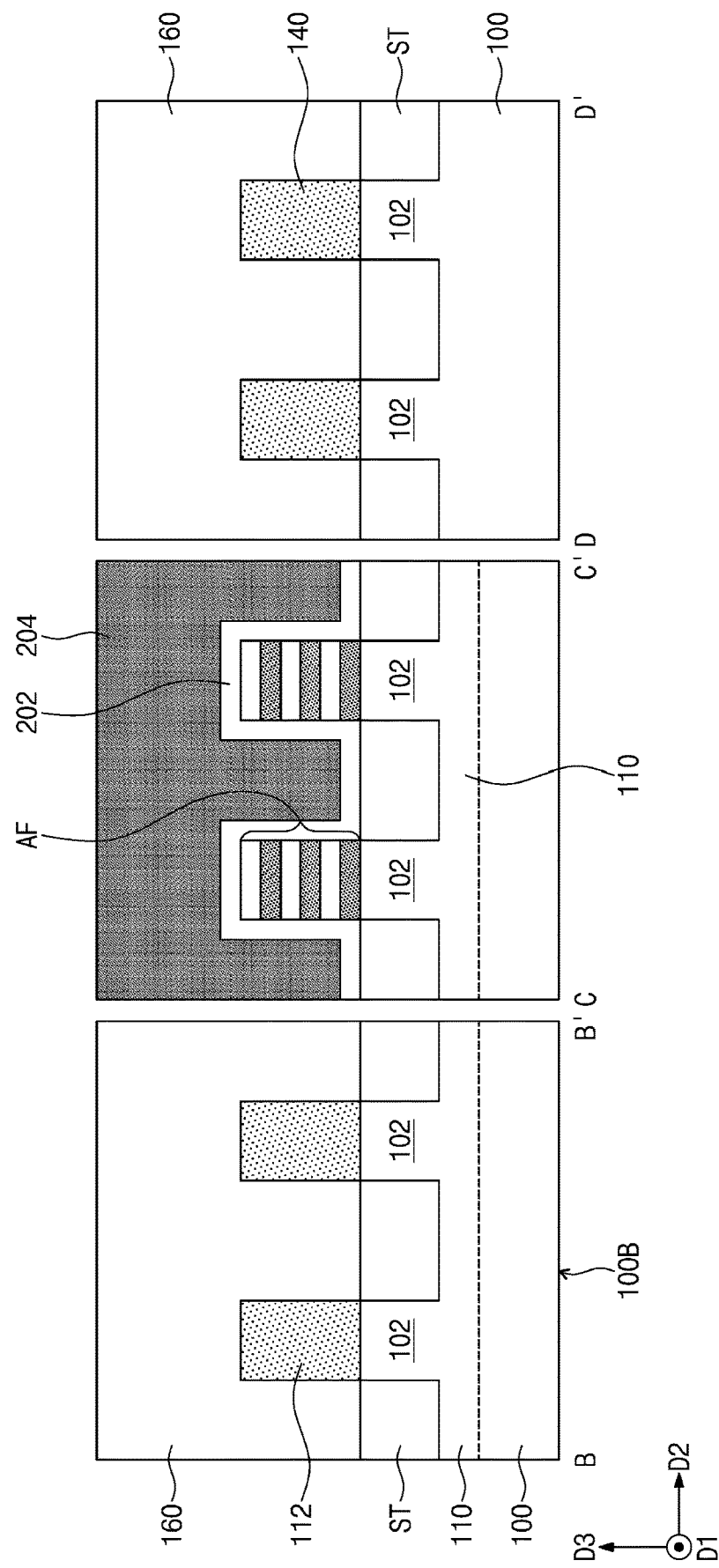
Figure 17:
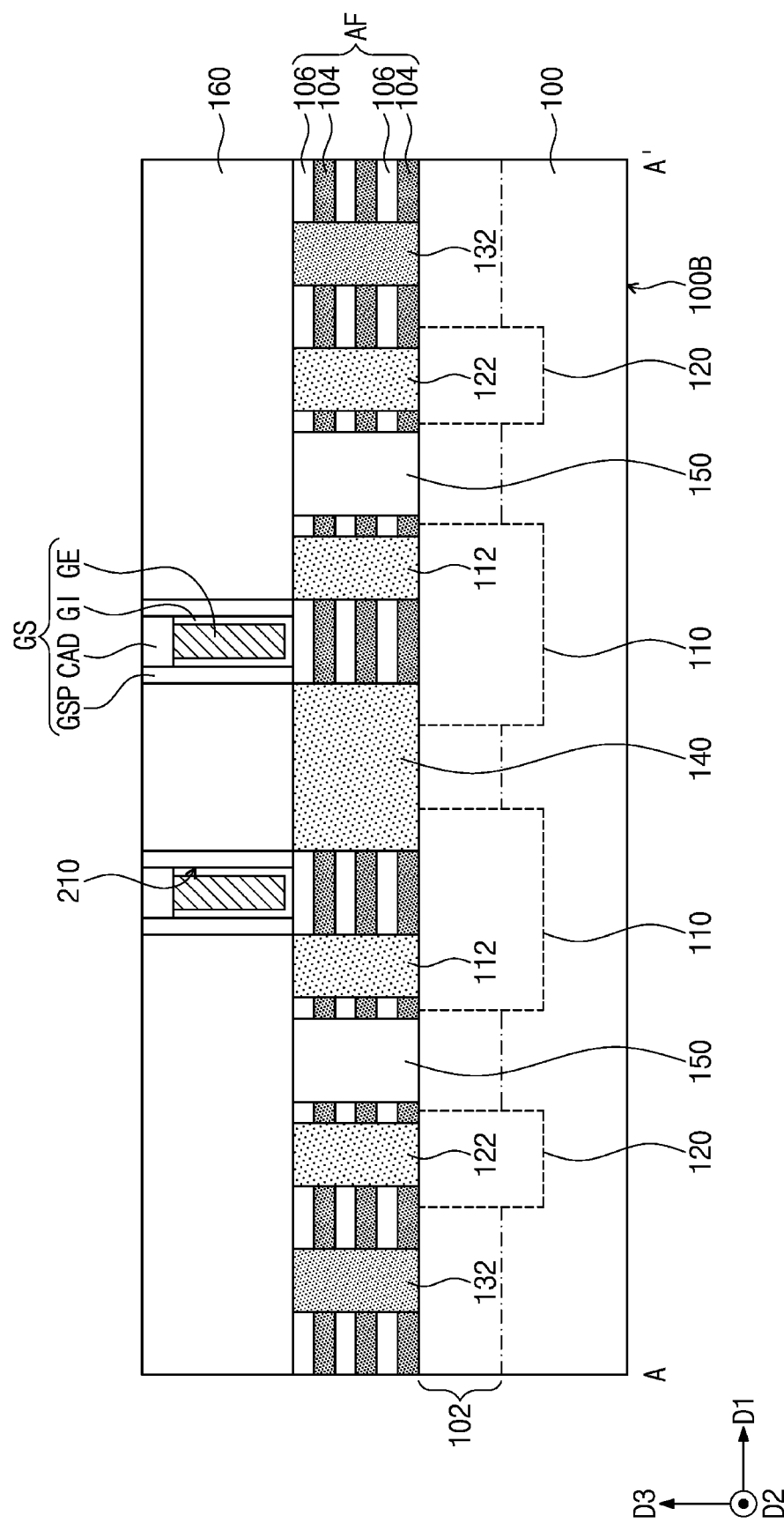

FIGS. 13 to 18 are sectional views illustrating a method of fabricating a semiconductor device, according to an embodiment of the inventive concept. FIGS. 13, 15, and 17 are sectional views, each of which is taken along the line A-A' of FIG. 1, and FIGS. 14, 16, and 18 are sectional views, each of which is taken along the lines B-B', C-C', and D-D' of FIG. 1. For concise description, the description that follows will mainly refer to technical features, which are different from those in the fabrication method described with reference to FIGS. 5 to 10.

Referring to FIGS. 1, 13, and 14, the first well regions 110 and the second well regions 120 may be formed in the substrate 100. The first well regions 110 and the second well regions 120 may be formed by injecting impurities of the first conductivity type into the substrate 100. The substrate 100 may have the second conductivity type that is different from the first conductivity type. In an embodiment, the formation of the second well regions 120 may be omitted.

The active patterns 102 may be formed in the substrate 100, and the active fin AF may be formed on each of the active patterns 102. In an embodiment, the formation of the active fin AF may include alternately and repeatedly stacking sacrificial layers and semiconductor layers on the substrate 100 and sequentially patterning the sacrificial layers and the semiconductor layers. As a result of the patterning of the sacrificial layers and the semiconductor layers, the sacrificial patterns 104 and the semiconductor patterns 106 may be formed on the substrate 100. The active fin AF may include the sacrificial patterns 104 and the semiconductor patterns 106, which are alternatingly stacked on the substrate 100.

The formation of the active patterns 102 may include patterning an upper portion of the substrate 100 to form the trenches T defining the active patterns 102 in the substrate 100. The trenches T may be extended in the first direction D1 to cross the first well regions 110 and the second well regions 120 and may be spaced apart from each other in the second direction D2. The active patterns 102 may protrude from the substrate 100 in the third direction D3, which is perpendicular to the bottom surface 100B of the substrate 100. The active patterns 102 may be extended in the first direction D1 and may be spaced apart from each other in the second direction D2. Each of the active patterns 102 may include the first well regions 110 and the second well regions 120.

The device isolation patterns ST may be formed in the substrate 100. The formation of the device isolation patterns ST may include forming a device isolation layer to fill the trenches T and recessing the device isolation layer to expose the active fin AF. In an embodiment, the recessing of the device isolation layer may be performed to expose not only a top surface of the active fin AF but also side surfaces of the active fin AF (e.g., side surfaces of the sacrificial and semiconductor patterns 104 and 106).

The insulating pattern 150 may be formed in the active fin AF to cross the active fin AF. The insulating pattern 150 may be extended in the second direction D2 to cross the active fins AF. In an embodiment, the formation of the insulating pattern 150 may include removing a portion of the active fin AF to form the empty region 150R in the active fin AF, forming an insulating layer to fill the empty region 150R, and planarizing the insulating layer to expose a top surface of the active fin AF. The forming of the empty region 150R in the active fin AF may include removing portions of the sacrificial and semiconductor patterns 104 and 106 to expose a top surface of a corresponding active pattern 102. In another embodiment, the insulating pattern 150 may be formed to extend from a region between the active fins AF into the substrate 100, as described with reference to FIG. 4. In this case, the empty region 150R may be formed by removing a portion of the active fin AF and an upper portion (e.g., at least a portion of a corresponding active pattern 102) of the substrate 100.

The sacrificial gate structures SGS may be formed on the substrate 100 to cross the active fin AF. The sacrificial gate structures SGS may be formed on the first well regions 110, respectively. Each of the sacrificial gate structures SGS may include the etch stop pattern 202, the sacrificial gate pattern 204, and the gate mask pattern 206, which are sequentially stacked on the substrate 100. The sacrificial gate pattern 204 may be formed to cover top and side surfaces of the active fin AF and may be extended to cover top surfaces of the device isolation patterns ST. The etch stop pattern 202 may be interposed between the sacrificial gate pattern 204 and the active fin AF and may be extended to a region between the sacrificial gate pattern 204 and the device isolation patterns ST. The gate mask pattern 206 may be extended along a top surface of the sacrificial gate pattern 204. Each of the sacrificial gate structures SGS may further include the gate spacers GSP, which are provided at both sides of the sacrificial gate pattern 204. The sacrificial gate structures SGS may be formed by substantially the same method as that for the sacrificial gate structures SGS described with reference to FIGS. 5 to 10.

Referring to FIGS. 1, 15, and 16, the connection doped region 140 may be formed in the active fin AF between the sacrificial gate structures SGS. In an embodiment, the formation of the connection doped region 140 may include removing a portion of the active fin AF between the sacrificial gate structures SGS to expose a top surface of a corresponding active pattern 102, performing a selective epitaxial growth process, in which the exposed top surface of the corresponding active pattern 102 is used as a seed layer, to form an epitaxial pattern, and injecting impurities of the first conductivity type into the epitaxial pattern, and here, the injection of the impurities may be performed during or after the selective epitaxial growth process. A concentration of impurities in the connection doped region 140 may be higher than that in the first well regions 110.

The first doped regions 112 may be formed in the active fin AF and on the first well regions 110, respectively. The first doped regions 112 may be connected to the first well regions 110, respectively. The second doped regions 122 may be formed in the active fin AF and on the second well regions 120, respectively. The second doped regions 122 may be connected to the second well regions 120, respectively. The first and second doped regions 112 and 122 may be formed by substantially the same method as that for the connection doped region 140. A concentration of impurities in the first doped regions 112 may be higher than that in the first well regions 110, and a concentration of impurities in the second doped regions 122 may be higher than that in the second well regions 120.

The third doped regions 132 may be formed in the active fin AF. The third doped regions 132 may be formed by substantially the same method as that for the connection doped region 140, except that the formation of the third doped regions 132 may include injecting impurities of the second conductivity type into epitaxial patterns.

The first interlayered insulating layer 160 may be formed on the substrate 100 to cover the sacrificial gate structures SGS and the active fin AF. The first interlayered insulating layer 160 may be formed to cover the connection doped region 140, the first to third doped regions 112, 122, and 132, and the insulating pattern 150. The first interlayered insulating layer 160 may be planarized until the sacrificial gate pattern 204 is exposed, and the gate mask pattern 206 may be removed by the planarization process.

Figure 18:
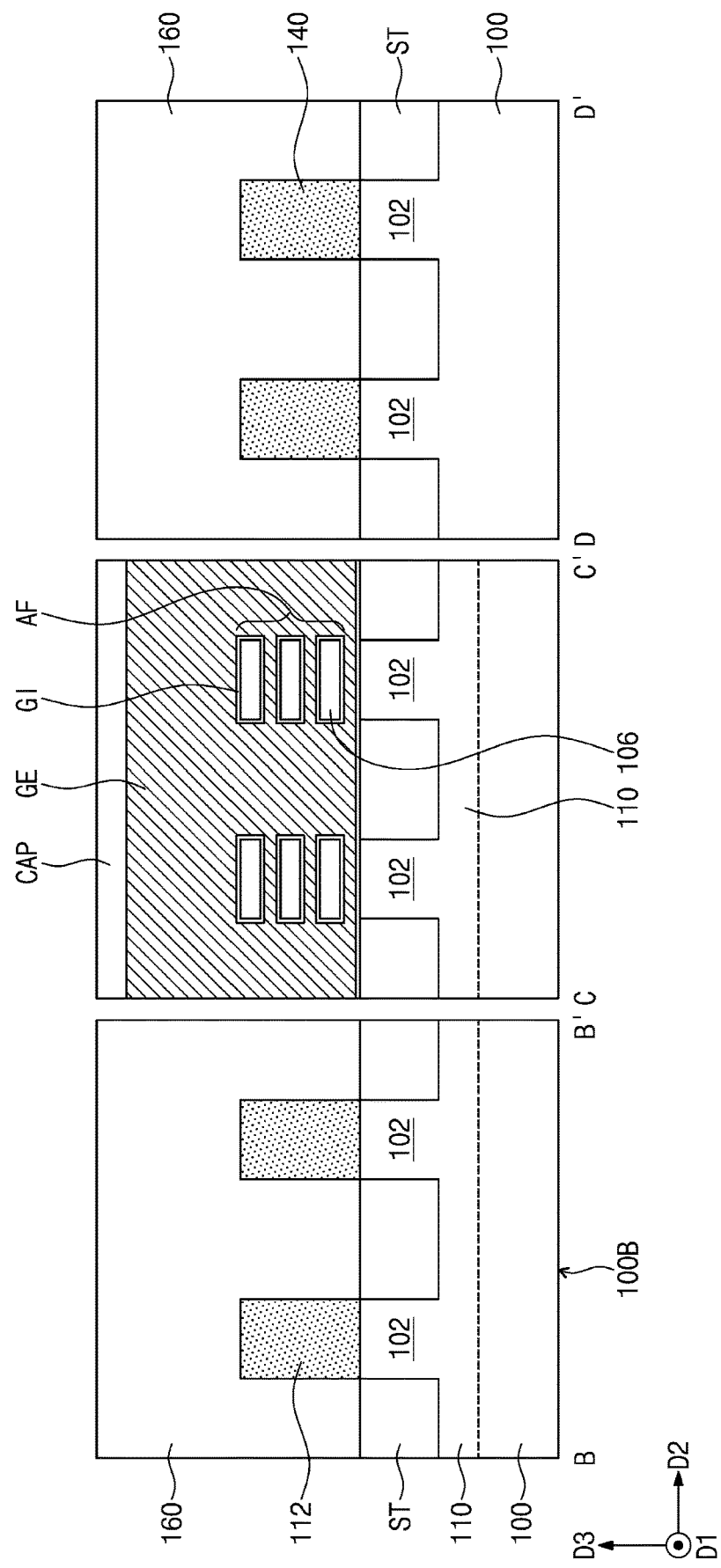

Referring to FIGS. 1, 17, and 18, the sacrificial gate pattern 204 and the etch stop pattern 202 may be removed, and thus, gap regions 210 may be formed in the first interlayered insulating layer 160. The gate insulating pattern GI, the gate electrode GE, and the gate capping pattern CAP may be formed to fill each of the gap regions 210. The gate insulating pattern GI, the gate electrode GE, the gate capping pattern CAP, and the gate spacers GSP may constitute the gate structure GS. The gate structure GS may be formed by substantially the same method as that for the gate structure GS described with reference to FIGS. 5 to 10.

Except for the afore-described differences, the method of fabricating a semiconductor device according to the present embodiment may be substantially the same as that described with reference to FIGS. 5 to 10.

Figure 19:
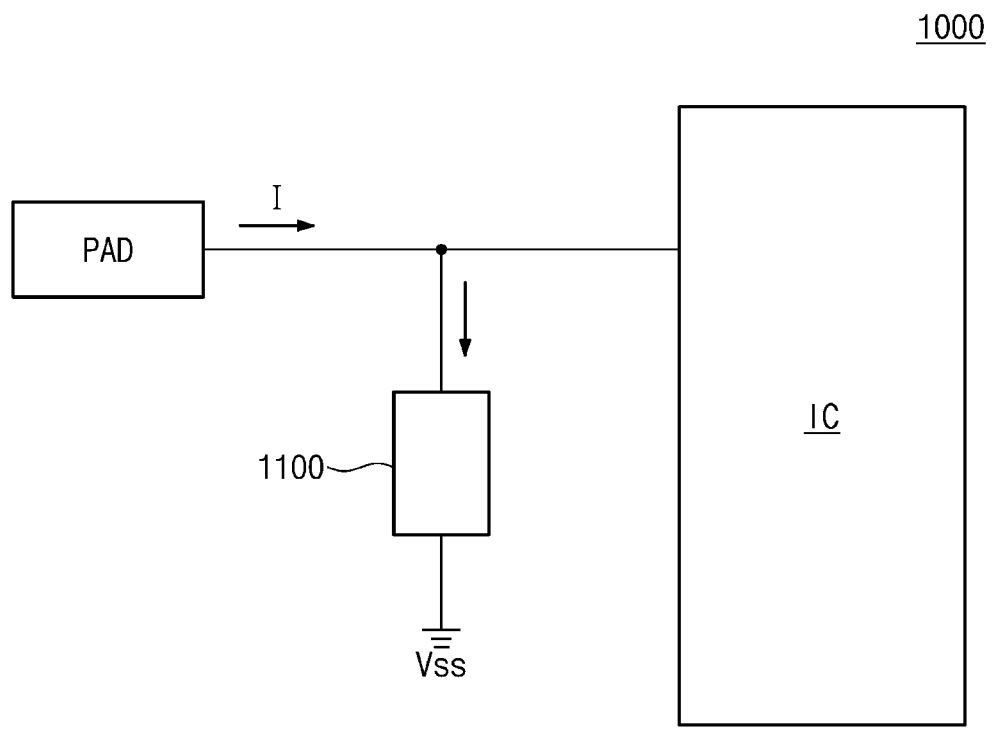
FIG. 19 is a conceptual diagram illustrating a semiconductor device according to an embodiment of the inventive concept.

FIG. 19 is a conceptual diagram illustrating a semiconductor device according to an embodiment of the inventive concept.

Referring to FIG. 19, a semiconductor device 1000 may include an integrated circuit portion IC provided with an integrated circuit, the pad PAD connected to an outer terminal, and an ESD protection device (or, ESD protection circuit) 1100 connected to the integrated circuit portion IC and the pad PAD. The integrated circuit portion IC may be composed of field effect transistors (FETs). In an embodiment, the integrated circuit portion IC may be composed of at least one of planar field effect transistors (planar FETs) having a planar channel structure, fin, multi-bridge-channel, gate-all-around field effect transistors (Fin-FETs, MBC-FETs, and GAA FETs) having three-dimensional channel structures, vertical FETs having a vertical channel structure, and negative-capacitance FETs (NC FETs) using negative capacitance. The ESD protection device 1100 may be configured to have substantially the same structure as the lateral bipolar junction transistor described with reference to FIGS. 1 to 4 and FIGS. 11 and 12. The ESD current I, which is supplied from the pad PAD during an operation of the ESD protection device 1100, may be discharged to the ground electrode Vss.

According to an embodiment of the inventive concept, it may be possible to easily provide the ESD protection device 1100, along with a field effect transistor having a three-dimensional channel structure, on a single substrate and to improve electric characteristics of the ESD protection device 1100.

According to an embodiment of the inventive concept, it may be possible to provide a semiconductor device including a highly reliable ESD protection device whose structure is integrated along with a field effect transistor of a three-dimensional channel structure.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:
   first well regions disposed in a substrate and spaced apart from each other;
   a connection doped region disposed between the first well regions; and
   a first interconnection line electrically connected to the connection doped region through a first contact,
   wherein the first well regions and the connection doped region include impurities of a first conductivity type,
   wherein a concentration of the impurities in the connection doped region is higher than that in the first well regions,
   wherein the first well regions extend into the substrate to a depth larger than that of the connection doped region, and
   wherein a first portion of the connection doped region is disposed in the first well regions and a second portion of the connection doped region directly contacts the substrate.

2. The semiconductor device of claim 1, wherein the substrate has a second conductivity type different from the first conductivity type, and wherein the connection doped region constitutes a PN junction, along with the substrate.

3. The semiconductor device of claim 1, further comprising:
first doped regions disposed in the first well regions, respectively,
wherein the connection doped region is disposed between the first doped regions and is spaced apart from the first doped regions,
wherein the first doped regions includes impurities of the first conductivity type,
wherein a concentration of the impurities in the first doped regions is higher than that in the first well regions, and
wherein the first interconnection line is electrically connected to the first doped regions through additional first contacts.

4. The semiconductor device of claim 3, wherein each of the first well regions extends into a region between each of the first doped regions and the connection doped region.

5. The semiconductor device of claim 3, further comprising:
a gate structure on the substrate,
wherein the gate structure is disposed on a corresponding one of the first well regions,
wherein the connection doped region is disposed at a side of the gate structure, and
wherein one of the first doped regions is disposed at an opposite side of the gate structure.

6. The semiconductor device of claim 1, further comprising:
a second well region disposed in the substrate and spaced apart from a corresponding one of the first well regions,
wherein the second well region is spaced apart from the connection doped region with the corresponding one of the first well regions interposed therebetween.

7. The semiconductor device of claim 6, further comprising:
a second doped region in the second well region,
wherein the second well region and the second doped region include impurities of the first conductivity type, and
wherein a concentration of the impurities in the second doped region is higher than that in the second well region.

8. The semiconductor device of claim 7, further comprising:
a third doped region disposed in the substrate and spaced apart from the second well region and the second doped region; and
a second interconnection line connected to the second and third doped regions through second contacts,
wherein the third doped region is spaced apart from a corresponding one of the first well regions with the second well region and the second doped region interposed therebetween, and
wherein the third doped region includes impurities having a second conductivity type different from the first conductivity type.

9. The semiconductor device of claim 6, further comprising:
an insulating pattern, which is between the corresponding one of the first well regions and the second well region,
wherein a height of a bottommost surface of the insulating pattern is equal to or lower than a height of a bottommost surface of the connection doped region.

10. A semiconductor device comprising:
a substrate including an active fin, the active fin protruding upward from the substrate and extending in a first direction;
first well regions in the substrate and spaced apart from each other in the first direction;
a connection doped region disposed in the active fin between the first well regions; and
a first interconnection line electrically connected to the connection doped region through a first contact,
wherein the first well regions and the connection doped region comprise impurities of a first conductivity type,
a concentration of the impurities in the connection doped region is higher than that in the first well regions, and
wherein a first portion of the connection doped region is disposed in the first well regions and a second portion of the connection doped region directly contacts the substrate.

11. The semiconductor device of claim 10, wherein the substrate has a second conductivity type different from the first conductivity type, and
wherein the connection doped region constitutes a PN junction, along with the substrate.

12. The semiconductor device of claim 10, further comprising:
first doped regions disposed in the active fin and the first well regions,
wherein the connection doped region is disposed between the first doped regions and is spaced apart from the first doped regions,
wherein the first doped regions include impurities of the first conductivity type,
wherein a concentration of the impurities in the first doped regions is higher than that in the first well regions, and
wherein the first interconnection line is electrically connected to the first doped regions through additional first contacts.

13. The semiconductor device of claim 12, wherein each of the first well regions extends into a region between each of the first doped regions and the connection doped region.

14. The semiconductor device of claim 12, further comprising:
a gate structure on the active fin to cross the active fin,
wherein the connection doped region is disposed at a side of the gate structure, and
wherein one of the first doped regions is disposed at an opposite side of the gate structure.

15. The semiconductor device of claim 12, further comprising:
a second well region, which is in the substrate and is spaced apart from a corresponding one of the first well regions in the first direction,
wherein the second well region is spaced apart from the connection doped region with the corresponding one of the first well regions interposed therebetween, and
wherein the second well region includes impurities of the first conductivity type.

16. The semiconductor device of claim 15, further comprising:
a second doped region, which is in the active fin and the second well region,
wherein the second doped region is spaced apart from a corresponding one of the first doped regions in the first direction,
wherein the second doped region includes impurities of the first conductivity type, and wherein a concentration of the impurities in the second doped region is higher than that in the second well region.

17. The semiconductor device of claim 16, further comprising:
a third doped region, which is in the active fin and is spaced apart from the second doped region in the first direction;
a second interconnection line electrically connected to the second and third doped regions through second contacts,
wherein the second doped region is between the corresponding one of the first doped regions and the third doped region, and
wherein the third doped region includes impurities having a second conductivity type different from the first conductivity type.

18. The semiconductor device of claim 16, further comprising:
an insulating pattern, which is in the active fin and between the corresponding one of the first doped regions and the second doped region,
wherein a height of a bottommost surface of the insulating pattern is equal to or lower than a height of a bottommost surface of the connection doped region.

19. A semiconductor device comprising:
a substrate including impurities of a first conductivity type;
first well regions disposed in a substrate, and including a first one of the first well regions and a second one of the first well regions that are spaced apart from each other in a first direction;
a connection doped region disposed between the first and second ones of the first well regions;
first doped regions disposed in the first well regions, respectively, the first doped regions including a first one of the first doped regions disposed in the first one of the first well regions and a second one of the first doped regions disposed in the second one of the first well regions; and
a first interconnection line electrically connected to the connection doped region and the first and second ones of the first doped regions through first contacts,
wherein each of the first and second ones of the first well regions, the connection doped region, and the first and second ones of the first doped regions includes impurities of a second conductivity type different from the first conductivity type,
wherein a concentration of the impurities in each of the connection doped region and the first and second ones of the first doped regions is higher than that in each of the first and second ones of the first well regions, and
wherein a first portion of the connection doped region is disposed in the first one of the first well regions, a second portion opposite to the first portion of the connection doped region is disposed in the second one of the first well regions, and a third portion between the first and second portions of the connection doped region directly contacts the substrate.

20. The semiconductor device of claim 19, further comprising:
a second well region spaced apart from the first one of the first doped regions;
a second doped region disposed in the second well region; and
a second interconnection line electrically connected to the second doped region through a second contact,
wherein each of the second well region and the second doped region includes impurities of the first conductivity type, and
wherein a concentration of the impurities in the second doped region is higher than that in the second well region.

* * * * *